(12) United States Patent
Sunthankar et al.

(10) Patent No.: US 6,936,145 B2
(45) Date of Patent: Aug. 30, 2005

(54) COATING METHOD AND APPARATUS

(75) Inventors: Mandar B. Sunthankar, Ft. Collins, CO (US); Daniel M. Storey, Longmont, CO (US)

(73) Assignee: Ionedge Corporation, Fort Collins, CO (US)

( * ) Notice: Subject to any disclaimer, the term of this patent is extended or adjusted under 35 U.S.C. 154(b) by 328 days.

(21) Appl. No.: 10/085,312

(22) Filed: Feb. 28, 2002

(65) Prior Publication Data

US 2003/0230483 A1 Dec. 18, 2003

(51) Int. Cl.⁷ .............................................. C23C 14/32
(52) U.S. Cl. ............................ 204/298.41; 204/192.38
(58) Field of Search ....................... 204/298.41, 192.38

(56) References Cited

U.S. PATENT DOCUMENTS

| | | | |
|---|---|---|---|
| 2,972,695 A | 2/1961 | Wroe | 313/157 |
| 3,783,231 A | 1/1974 | Sablev et al. | 219/123 |
| 3,793,179 A * | 2/1974 | Sablev et al. | 204/298.41 |
| 4,448,799 A | 5/1984 | Bergman et al. | 427/580 |
| 4,511,593 A | 4/1985 | Brandolf | 427/562 |
| 4,556,471 A | 12/1985 | Bergman et al. | 204/298.41 |
| 4,609,564 A * | 9/1986 | Pinkhasov | 427/580 |
| 4,645,895 A | 2/1987 | Boxman et al. | 219/76.13 |
| 4,724,058 A * | 2/1988 | Morrison, Jr. | 204/192.38 |
| 4,762,756 A | 8/1988 | Bergmann et al. | 420/698 |
| 4,919,968 A | 4/1990 | Buhl et al. | 427/580 |
| 4,929,321 A | 5/1990 | Buhl | 204/192.38 |
| 5,037,522 A * | 8/1991 | Vergason | 204/298.41 |
| 5,126,030 A | 6/1992 | Tamagaki et al. | 204/192.38 |
| 5,269,896 A * | 12/1993 | Munemasa et al. | 204/192.38 |
| 5,269,898 A | 12/1993 | Welty | 204/298.41 |
| 5,298,137 A | 3/1994 | Marshall, III | 204/192.12 |
| 5,380,421 A * | 1/1995 | Gorokhovsky | 204/298.41 |
| 5,744,017 A | 4/1998 | Tamagaki et al. | 204/298.41 |
| 5,824,988 A | 10/1998 | Tylko | 219/121.36 |
| 5,895,559 A * | 4/1999 | Christy | 204/192.38 |
| 5,932,078 A | 8/1999 | Beers et al. | 204/298.41 |
| 5,972,185 A | 10/1999 | Hendricks et al. | 204/298.41 |
| 6,465,793 B1 | 10/2002 | Anders | 250/426 |

FOREIGN PATENT DOCUMENTS

| | | |
|---|---|---|
| EP | 0 211 413 A2 | 2/1987 |
| EP | 0 586 702 A1 | 3/1994 |
| EP | 0 677 595 A1 | 10/1995 |
| EP | 0 711 847 A1 | 5/1996 |
| JP | 60043482 | 3/1985 |
| JP | 05-009722 * | 1/1993 |
| SU | 1466264 A1 | 12/1992 |
| WO | WO 85/03954 | 9/1985 |

OTHER PUBLICATIONS

Machine Translation of JP 05–009722.*
New International Search Report replacing earlier one.
International Preliminary Examination Report dated Mar. 14, 2005 for International Application No.: PCT/US03/06164.
Written Opinion dated Dec. 27, 2004 for International Application No.: PCT/US03/06164.
Copy of International Search Report.

* cited by examiner

*Primary Examiner*—Rodney G. McDonald
(74) *Attorney, Agent, or Firm*—Rick Martin; Patent Law Offices of Rick Martin, P.C.

(57) ABSTRACT

A method and apparatus used for the application of plating/coating in a cathodic arc process to improve coating uniformity, deposition rates, quality, cost, packaging, arc triggering, target wear and other improvements is described in the patent. The process improvements utilize a cathode with external current switching to two or more electrical cathode contacts, employment of magnets on the backside of the cathode, a non-mechanical arc initiation trigger, patterned target surfaces, adjustable cathode insulation, current modulation, and new packaging schemes.

31 Claims, 18 Drawing Sheets

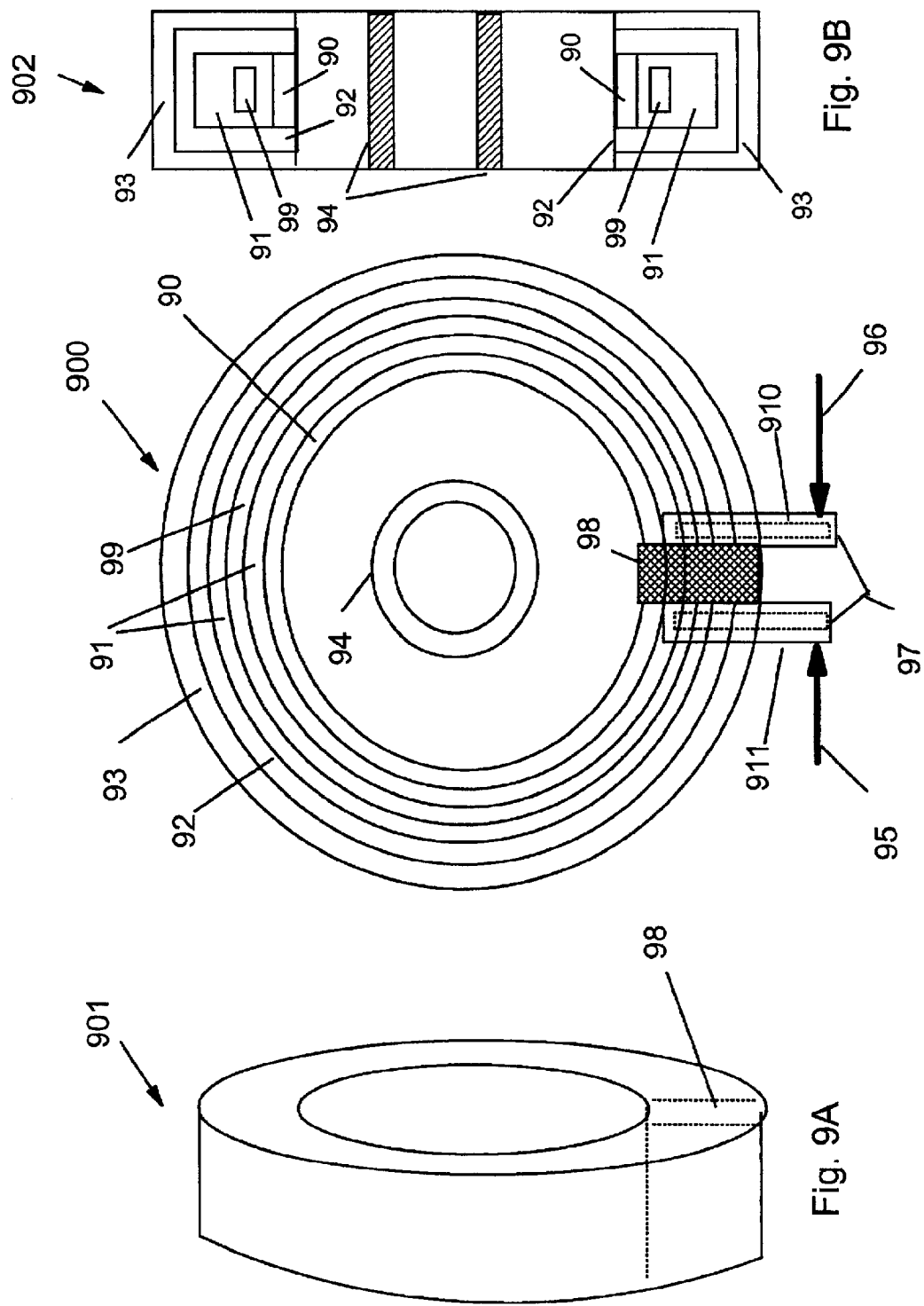

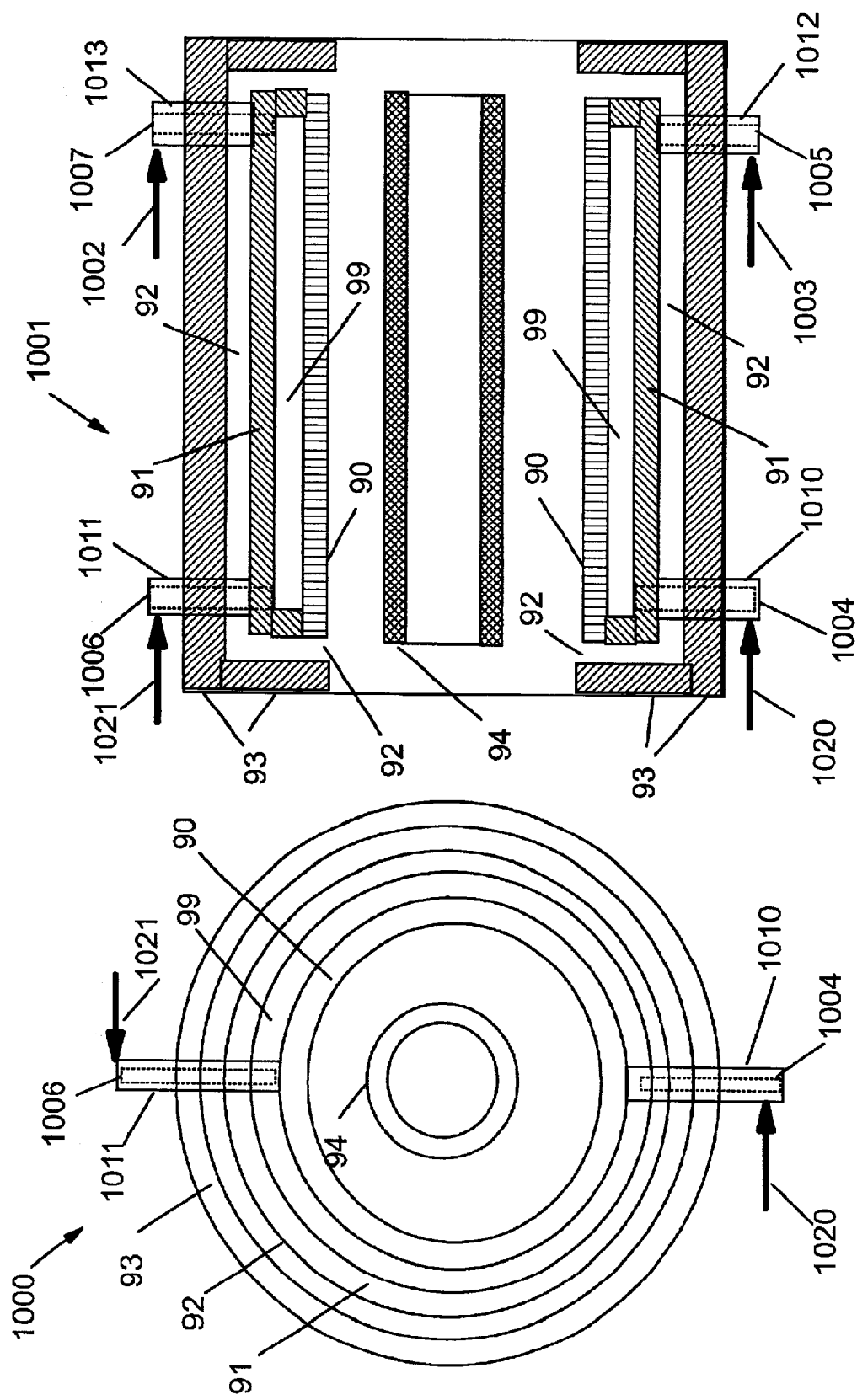

COATING METHOD AND APPARATUS

FIELD OF THE INVENTION

The present invention relates to an improved method and apparatus for the application of coatings using a cathodic arc process. The process utilizes a cathode that uses external current switching, improvements in the cathode design and assembly, current switching means, new arc-striker design, adjustments for even target erosion, low frequency pulsed arc and waste reduction.

BACKGROUND OF THE INVENTION

Arc evaporation techniques for physical vapor deposition have been long known in the vacuum coating industry. This coating technique employs an electric arc, wherein an arc is intentionally struck on a material to be vaporized, i.e. target, and the resultant electrical energy contained in the arc then vaporizes the material, thus creating a vapor stream. The elements present in such apparatus can be generalized to include an electrically biased coating "target" material, which serves as one electrode (usually the cathode). Another portion of the deposition chamber is biased at a second potential, different from the target potential, and acts as the second electrode (usually the "anode") of the electric arc discharge circuit. An arc-initiating trigger element is positioned in proximity to the cathode source and is positively biased with respect to the cathode. The arc trigger element is momentarily allowed to engage the surface of the cathode material, establishing a current flow path through the trigger and cathode. As the trigger element is removed from engagement with the cathode source, an electrical arc is initiated, which is thereafter maintained between the cathode and the anode electrodes. The arc then provides the energy for vaporizing the target material constituting the cathode. The electrical discharge is carried out in a chamber that is normally maintained at negative pressure. The vaporized source material includes atoms of the source material, ions of such atoms, molecules containing atoms of the source material, ions of such molecules, electrons and radicals. The ionized portion of the vapor cloud, associated electrons and radicals are called "plasma". The high-energy point on the cathode at which the vaporization is occurring is often called the "cathode spot."

Several techniques are known for coating by physical vapor deposition using the vacuum arc discharge. The various techniques can be differentiated by their attempts to improve design performances and coating process parameters. Historically, the first attempts employed only the natural physical properties of the arc discharge plasma produced by cathode spots for a coating deposition. Latter design efforts focused on stabilization of the discharge on the cathode surface, improving cathode material utilization, and improving the reliability of the arc ignition. Stabilization was usually achieved using some magnetic, electrostatic, or physical method for controlling or limiting movement of the cathode spot. The resulting vapor, neutral and ionized, and plasma stream generated by the cathode spots diffused during propagation. The vapor density naturally decreased with the square of the distance between the cathode and the substrate. The magnetic fields that were meant to control cathode spot movement were not strong enough to substantially change the vapor flow parameters.

U.S. Pat. No. 2,972,695 (1961) to Wroe relates to cathodic arc stabilization, which has basically remained unchanged in the plating industry.

U.S. Pat. No. 3,783,231 (1974) to Sablev et al. describes a method of vacuum-evaporization of metals under the action of an electric arc and use of a magnetic field.

U.S. Pat. No. 4,448,799 (1984) to Bergman et al. describes a trigger apparatus and method for striking an electrical arc at the surface of a coating source material within a vapor deposition chamber is disclosed. This invention relates generally to electric arc vacuum physical vapor deposition coating systems, and in particular to a trigger apparatus and metal for striking an electric arc on the coating source electrode material to initiate generation of a coating plasma within the deposition chamber.

U.S. Pat. No. 4,511,593 (1985) to Brandolf describes a method and apparatus for vapor depositing node-free coatings on substrate surfaces, preserving the pre-coating surface finish dimensions of the substrate.

U.S. Pat. No. 4,556,471 (1985) to Bergman et al. describes a gap used in preventing arc from going over the cathode edge and relates to an electrode mounting assembly for an electric arc vapor deposition machine.

U.S. Pat. No. 4,645,895 (1987) to Boxman et al. describes a method of surface-treating a workpiece characterized in applying one or more short-duration electrical pulses to produce, for each pulse, a high amplitude short-duration electrical discharge between the workpiece, serving as the anode, —and coating target material serving as the cathode.

U.S. Pat. No. 4,762,756 (1988) to Bergmann et al. describes a method for the thermochemical surface treatment of workpieces in reactive gas plasma.

U.S. Pat. No. 4,919,968 (1990) to Buhl et al. describes a continuous vapor deposition on the cathode surface with a metal compound which can be broken down, by which accelerated migration of the vapor emitting hot spots is forced in such a way that the hot spots migrate away from a particular site before spatter formation starts.

U.S. Pat. No. 4,929,321 (1990) to Buhl describes a method and arrangement for vacuum coating of workpieces by arc evaporation, comprising of at least one evaporating cathode with a surface to be evaporated and an axis of the cathode intersecting the cathode surface.

U.S. Pat. No. 5,037,522 (1991) to Vergason describes an electric arc vapor deposition device in which the negative side of an arc power supply is switched back and forth between the two ends of a cylindrical cathode using an arc sensor and related electronics to cause the arc to travel back and forth along the length of the cathode.

U.S. Pat. No. 5,126,030 (1992) to Tamagaki et al. describes a cathodic arc deposition method and apparatus, including an arc evaporation source containing a film forming material.

U.S. Pat. No. 5,269,896 (1993) to Munemasa et al. describes cathodic arc deposition system and includes a cathode made of a film forming material, a shield surrounding a circumferential side of the cathode with a gap, a vacuum chamber having the cathode and the shield therein, and a substrate to have deposited at a surface.

U.S. Pat. No. 5,269,898 (1993) to Welty et al. describes a method for depositing a coating onto a substrate using vacuum arc evaporation from a substantially cylindrical cathode surrounded by an electromagnetic coil for arc control. This method also utilizes an arc sensor and electronics for switching current between two ends of the cathode.

U.S. Pat. No. 5,298,137 (1994) to Marshall describes an emission enhanced sputtering magnetron apparatus which includes an elongated rod or bar like cathode jacketed by a target material.

U.S. Pat. No. 5,744,017 (1998) to Tamagaki et al. describes a vacuum arc deposition apparatus which includes arc power sources having cathodes connected to both ends of an evaporation source; exciting coils disposed at positions axially outwardly far from both the ends of the evaporation source so as to be coaxial with the evaporation source; and coil power sources independently connected to the exciting coils.

U.S. Pat. No. 5,895,559 (1999) to Christy describes a cathodic arc cathode provided with a gap and an insulating ring in close proximity to the underside of a cantilevered edge of the target. The patent also describes two high resistivity elements to manage the arc movement about the cathode.

U.S. Pat. No. 5,932,078 (1999) to Beers et al. describes an apparatus for applying material by cathodic arc deposition to a substrate including a vessel means for maintaining a vacuum in the vessel, a cathode, a contactor, means for selectively sustaining an arc of electrical energy between the cathode and the anode, and an actuator.

U.S. Pat. No. 5,972,185 (1999) to Hendricks et al. describes an apparatus for applying material by cathodic arc vapor deposition to a substrate including a vessel, apparatus for maintaining a vacuum in the vessel, an annular cathode having a bore and an evaporative surface extending between first and second end surfaces, apparatus for selectively sustaining an arc between the cathode and anode, and apparatus for steering the arc around the evaporative surface using an electromagnetic coil.

What is needed is an apparatus with more uniform and economical utilization of the target material for deposition; a relatively simple, economical and robust method of striking an arc; a self-sustaining electric arc triggering unit; a relatively simple, economical, and robust method of controlling and steering the arc movement as well as arc-speed on the desired target surface; ability to use higher currents to increase deposition rate; more efficient utilization of target material vapors for deposition to reduce waste deposits on the chamber walls thus further enhancing the deposition rate; more efficient method of packaging a cathode/anode electrode combination; improvement in coating uniformity on larger surface areas; and lower equipment cost, maintenance cost and down-time. The present invention addresses these areas and resolves many deficiencies of prior art by stated improvements in several areas.

SUMMARY OF THE INVENTION

The main aspect of the present invention is employment of a relatively simple method and apparatus of controlled current switching employing an external switching device that steers the arc and controls the arc speed between desired contact points on an electrode or cathode.

Another aspect of the present invention is to expand the design such that controlled current switching is directed to more than one cathode, including more than one electrode (or contact point) on each cathode.

Another aspect of the present invention is employment of magnetic fields on the back of the cathode to modify arc travel path and motion.

Another aspect of the present invention is the design and employment of a self-regenerating arc trigger to initiate an arc.

Another aspect of the present invention is the modification of target surface finish in desired areas to substantially increase the vapor deposition rate.

Another aspect of the present invention is the ability to coat internal or external surfaces of round or cylindrical objects.

Another aspect of the present invention is the creation of an adjustable insulation backing, with an edge parallel to the target erosion surface and the level of the edge to be greater than zero with respect to the target erosion surface.

Another aspect of the present invention is a design with an insulator forming a gap adjacent to the target erosion surface instead of beneath the target.

Another aspect of the present invention is the utilization of a low frequency pulsed current arc which will help reduce the macro particle emission and increase deposition rates.

Another aspect of the present invention is the utilization of a logical current toggle control system to control current switching to a plurality of cathodes, each with a plurality of inputs. The logical current toggle control system also having a plurality of inputs to receive current from a current control system with multi-outputs.

Other aspects of this invention will appear from the following description and appended claims, reference being made to the accompanying drawings forming a part of this specification wherein like reference characters designate corresponding parts in the several views.

The apparatus of the present invention addresses design improvements over prior art, which result in improvements attained in coating rate, coating quality and uniformity, equipment cost and maintenance cost.

The main advantages over prior art are in design improvements which are described below. These improvements include:

a. Current toggle switching directed to one or more electrical contacts on the cathode;

b. Current toggle switching directed to one or more electrical contacts on more than one cathode;

c. Employment of magnets on the back of the cathode;

d. A non-mechanical arc trigger to initiate an arc;

e. A machined pattern on the target surface, such as sawtooth grooves or threads in the case of a cylindrical shaped target;

f. Design of an anode/cathode packaging scheme in which both the anode and cathode are packaged within one physical unit and one, in which the insulation can be moved adjacent to the target surface;

g. Creation of level adjustable insulation surrounding the target to keep the insulation edge level difference to be greater than zero with respect to the target erosion surface;

h. Utilization of a low frequency pulsed current allowing a pulsed arc deposition;

i. An internal to workpiece cylindrically shaped cathode either rod or tube type for plating the internal surface of a workpiece; and j. A cylindrical, doughnut or ring shaped cathode for plating the external surface of a workpiece.

DETAILED DESCRIPTION OF THE INVENTION

The present invention employs an external device that provides a method of current switching (toggling) to steer the arc between desired contact points of the cathode(s). As the current switching occurs, the power is transferred from one cathode lead (electrical contact point) to another cathode lead, each cathode lead being separated from the other as desired. The toggle switch toggles current between different contact points on the cathode. The benefit of this switch is to control the starting point of the arc and thus be able to move the arc in a relatively controlled manner allowing for even target wear. The wear achieved is superior to prior art resulting in better utilization and lower cost of the target material. In addition, the arc can be made to travel faster with the toggle speed as desired.

The basic implementation of the toggle switch of the present invention has many different aspects. It is first necessary to discuss the benefits of the toggle switch in comparison with the prior art. First, current toggling helps to keep the arc on the major target surface (i.e. facing the substrates). In the prior art, many attempts were made to address the problems associated with an arc's tendency to dwell in certain areas of the target, especially for flat surface cathodes. An arc-dwelling for a relatively longer period of time in certain areas of the target is a common problem in prior art and has been addressed using magnetic fields for steering. The arc-dwelling problem causes deep erosion at specific locations on the target surface resulting in non-uniform vapor deposition as well as waste deposits on the walls and results in the need for early replacement of targets thus wasting target material and increasing downtime and maintenance. One method used in prior art is to put a high temperature, insulating ring (such as Boroan Nitride) in contact with the target edge in an attempt to stop the arc from dwelling on the edge. This method is not reliable and yet expensive. Since a high temperature, insulating ring only lasts a short period of time, the downtime cost for replacement is relatively high.

An attempt at containment of the arc is described in U.S. Pat. No. 5,895,559, which claims a set of resistors to spontaneously manage the arc travel between two poles of the cathode combined with a gap to quench the arc if it were to get too close to the edge of the target. The resistor design lacks control over arc speed and path, and consequently, the arc has the tendency to hang on the side of the target not facing substrates for most target materials. This hanging also leads to the accumulation of deposits in the gap, quick deterioration of the insulation and eventual-early failure of the gap. The present invention will also eliminate currents flowing through resistors, which generate adverse magnetic fields on the cathode back negatively influencing arc travel. High currents generate high heat in resistors, consume high power, and result in resistor meltdown unless water-cooled. The aforementioned resistors also have to be in the vicinity of the cathode and will not function otherwise.

Other attempts at containment of the arc are described in U.S. Pat. No. 5,037,522 and U.S. Pat. No. 5,269,898 (cited above). These methods utilize arc sensors to detect, stop and to reverse the arc if it gets too close to the edge of the cathode. These methods work relatively well, but due to the nature of the invention, are expensive and relatively complex. The methods require additional power supplies and a complicated set of electronics that would be susceptible to the RF noise produced by said arc. This arrangement would be difficult to maintain and expensive to repair when it breaks down. Besides, switching described in these patents would be increasingly complex, difficult, and expensive at increasingly higher speeds and at higher currents.

In the present invention's development of a toggle switch, all the above was taken in to consideration to correct deficiencies and simplify the design. Resistors, sensors and electromagnetic arrangements have been eliminated and the switch was designed with many new and improved features. The first important aspect is toggling current between at least two electrical contacts on the cathode with expandability to more contacts. These contacts allow the arc to be maneuvered between the two or more points on the attached target. The reason for two or multiple contacts is that the arc tends to run to the negative contact point of the input power. Thus, if the contact point of the input power is moved, the arc will move accordingly. With this configuration, the arc can be made to travel in any pre-designed path, or can be linked to a computer and made to move randomly. Toggling allows more even target erosion, prevents arc dwelling, reduces damage to insulation on the edge of the gap, reduces contamination and particle ejection from damaged insulation, and reduces macro-particle generation due to a faster arc travel speed. It must be noted here that the speed of the arc is controlled and can be made to go faster or slower, depending on the application requirements (though the cycle time must be greater than zero for obvious reasons.) However, for a given current and without the influence of magnetic fields, the fastest possible switching speed is determined by the distance between the toggle points, and reaches a maximum for that distance. With this constraint, a toggle-switch design can take various forms. Several, but not all possible designs, will be described below. The toggling concept has been tested with toggle switch frequencies up to 300 cycles per minute and with currents up to 600 amperes. The maximum possible arc speed and toggle switching speed need to be taken into consideration in the design parameters, especially in longer length cathode surfaces with longer distance contact points.

The main embodiment of the present invention employs an apparatus consisting of an electrically conductive, rotating cylindrical body, such as that made of copper, to switch and distribute the current to the desired contact end of the cathode via brush contacts formed about the cylinder. In a two-contact design, the conductive cylinder would be designed such that slightly less than half the circumference (cross-sectional area) would be an insulator (i.e. air, plastic, ceramic etc.) and the balance would be the conductor including an input conductive shaft. The two opposing external brushes would be installed such that one brush would start making contact to the outside cylinder wall surface just as the second brush would be exiting the contact to the surface as the cylinder is rotated about its shaft. The design would insure that one contact is thus active just prior to and concurrent to the second contact being made to sustain the arc and prevent need for re-triggering. Alternatively, if the arc could be sustained using other means (electromechanical, electromagnetic, electronic, or other), then the active overlap between two cathode contact points is not necessary. The electron current would enter via the cylinder shaft (which would be in contact, via brushes, to the negative end of the power source) and exit via opposing brush contact points. The brushes could, in turn, be connected to each of two cathode input points at opposite ends of the cathode. Rotational speed of the cylinder would thus control the frequency of current switching. Rotation speed of the cylinder can be controlled by such means as a variable speed motor driving the shaft directly, or connected to the cylinder (or shaft) by a gear mechanism. This system can be built with a compact and robust design using relatively simple parts. One minor drawback of this particular design would be that the only controls would be the rotational speed of the shaft versus a completely random automated control (which could even further improve target performance). In this embodiment, additional cathode contacts could be employed with the additional external cylinder brushes such that any two brushes would be in contact with the conducting cylindrical surface at one time and such that one of the two opposing contacting brushes would exit its contact just as a second brush would make contact (thus again avoiding an open circuit to the input source).

An alternate embodiment of a current switching design is employment an apparatus of the present invention consisting of a disk shaped current switch. In this alternate embodiment there are two possible configurations:

1. A moving (rotating) disk with stationary brushes; or
2. Moveable brushes with a stationary disk.

The first of these configurations would have a conductive disk with a portion of its surface area cut away or removed (similar to the cylinder described above). The removed portion could be filled with "air" or an insulating material. Two brushes (in a two-contact design) would contact the revolving disk such that one contact is active just prior to, and concurrent to, the second contact being made in order to avoid an "infinite" load being presented to the current source. The electron source would enter via a rotating shaft of the disk (which would be in contact, via brushes, to the negative terminal of the input power source). Current would exit via the external brush contact points similar to the cylinder design described above. Again, more contact points could be made as in the cylinder design. The second design would employ a stationary disk (with an insulating cut out) and moveable brushes. The brushes could be mounted to rotate in a circular motion about the disk. As in the first design, two opposing brushes would be in contact with the conductive part of the disk such that one contact is active just prior to, and concurrent to, the second contact being made in order to avoid an "infinite" load being presented to the current source. This design would allow for a faster motion and stable operation while allowing a variety of design patterns to control an ordered motion.

Yet another alternate embodiment of the present invention is to employ an apparatus consisting of a linear reciprocating device, which will still be further described in figures below. This alternate embodiment employs a series of plates such that a brush connected to a rail (or belt), which is driven by a motor passes over. These plates are connected to separate points on the cathode, and the moveable brush is connected to the input power supply. The motor can be connected to a computer and random number generator so the motor can jump the moving brush from one plate to another, thus allowing for a random arc path. This system can also be extended to include as many outputs as required.

The current toggling designs described above provide frequency regulated current switching with a frequency that is a function of rotational speed or reciprocating speed and the dimensions of the design(s). The focus of this aspect of the invention is the direct switching of the current. The methods of switching described are not necessarily the only designs that could be employed. For example, other electromechanical, electromagnetic, electronic and other means of switching could be employed for current switching between contact points. The method(s) of current switching described above result in excellent control over arc steering and speed leading to a very even ware (erosion) of the target material. It also results in the reduction of macro particles. The macro particle level in vapor stream is usually dependent on the speed at which the arc travels and the magnitude of current in the arc. The present invention's feature of faster current switching allows the arc to move at higher speeds thus reducing the macro particles in the vapor stream. Prior art's practical current level limitations (normally less than 300 amps) were necessary to control the production of macro particles, which increased with increasing current.

The design of the present invention overcomes this problem with the current switching means described above. The result is a better coating quality in terms of more uniformity and higher density along with reduced cycle times. The design of the present invention also allows for a cathode to be run at much higher currents than 300 amps. Currents up to 600 amps have been demonstrated. Prior art, even if able to overcome the problems mentioned above with macro particles vs. current amplitude, have to overcome higher heating conditions with heating of resistors or magnetics. The present invention also allows for the use of a water cooling system to remove heat from the toggle switch. Employment of a higher current is thus possible and results in faster process cycles.

The use of current switching as described above provides other advantages. There is no location dependence of the toggle switch from a vacuum system. As noted above, other designs in prior art required "resistors" to be placed directly behind the cathode (U.S. Pat. No. 5,895,559) or a need to place, in vacuum, a set of electromagnets or permanent magnets on the back of the cathode to control the arc. The present invention does not have these type constraints, as the switching mechanism can be remotely located outside of the vacuum.

The design of the current switching method(s) of the present invention thus also greatly simplifies the design over prior art as it eliminates the need for arc sensors inside the vacuum (such as circuitry for switching current), resistors, pneumatics, expensive ceramics to limit the arc travel, and, complex cathode designs. It reduces the switching system manufacture cost, is a simple design to understand and maintain, reduces the cost of special feedthroughs, eliminates complex and expensive cathode designs, and eliminates complex and expensive electromagnetic arc steering on the back of the cathode. The aforementioned design is also more robust, not being effected by current or usage, able to withstand current surges due to lack of electrical components housed within the vacuum, and providing a relatively simple mechanical construction within the vacuum reducing the chance of breakdown. The aforementioned design also eliminates a need for additional power supplies for switching current. In the case of flat cathode designs, the current toggle switching also reduces extraneous deposition on the walls and vacuum fixtures as the majority of vapor steam is in a forward direction to the target erosion surface. Thus, in the case of a flat or concave shaped erosion surface target, there is no deposition behind the target and cathode area. This results in an increased coating rate and thus a reduced cycle time, improving the economics of the coating process. This also results in a reduction in waste deposits on the sidewalls, which reduce downtime for cleaning and maintenance while providing an environmentally safer condition with the reduction in waste disposal.

The toggled current switching as described above also results in more reliable and effective arc control and economical steering. This allows for the use of larger cathode/target evaporative surface areas than prior art resulting in reduced number of cathodes/targets to cover larger coating surfaces, thus further reducing manufacturing costs, maintenance and downtime. Larger targets require larger currents to maintain the deposition rate and, as described previously above, the present invention can easily handle higher currents and faster toggle switching speeds.

It should be noted that specific designs described above could easily be expanded to toggle switching utilizing multi-cathodes (including multi-contacts at each cathode). It also should be noted that although the designs above have been described with reference to cathodic arc apparatus, the concepts could easily be extended to other applications such as sputter deposition apparatus.

The present invention also provides for the option of placing a magnetic field on the backside of the cathode and in contact with the cathode body. The addition of a magnetic field in this region helps to alter arc path and speed as compared to non-presence of a magnetic material. There are various configurations of the magnets and placement.

The present invention also provides an apparatus design consisting of a non-mechanical arc trigger to initiate an arc. Prior art utilized an arc trigger that was physically moved to come into contact with the target. A limiting current is applied and the trigger, usually tungsten, to initiate the arc followed by the arc trigger being mechanically moved away from the target. In the present invention a ceramic striker (or other insulator material capable of being metallically plated) is pre-plated with a thin metallic film and attached directly into contact with the negatively biased target. Alternatively, a conductive ceramic body could also be used. An input lead is then attached to one end of the striker whereby the lead is in contact with the metallic film. The input lead is then grounded through a normally "open" switch controlled by a relay coil. When a timed control power is applied to the relay coil it is momentarily activated and the switch closes. A limiting current (approximately 10 amps) flows through the plated ceramic striker and the arc is struck or initiated. The momentary current that initiates the arc may burn the thin-coated plating/coating away from the striker. However, in the design of the present invention, the ceramic striker is re-plated by the target material with the initiation of the arc and/or during sustained arc operation. Thus, the ceramic striker is automatically re-electrically attached to the target and thus automatically made ready for the next future arc initiation. There is no mechanical movement of the striker, thus there are no moving parts or pneumatic devices required (reducing particle generation), no special or machined fixtures, use of off-the-shelf parts, no additional power supply, less controls which all result in both a lower cost and lower maintenance. There is no need for parts to move through the chamber wall (as in prior art) but simply an electrical feed through. The arc trigger is a simple, thin, and narrow or round piece of ceramic (metallically coated), is easy to construct and repair, has little possibility of breakdown (more reliable than prior art) and a greater longevity than in prior art. It also can sustain temperatures well above 600° F. It can be remotely controlled. A simple relay on the outside of the vacuum chamber is all that is required to momentarily short it to ground or to the anode. Alternatively, the input lead could be manually grounded outside the chamber momentarily. It is a self-generating device when cathodic arc plating is in operation. It is also non-contaminating. Prior art will produce a certain level of contamination from the material of the arc trigger as the trigger is burned with the target thus momentarily vaporizing/contaminating the target, substrate(s) and vacuum system itself. It also should be noted that the applications of a striker as described above could easily extend to other applications such as triggering plasma in other vapor deposition methods, The present invention can also employ a patterned (treated or reshaped) target surface. Reshaping a standard flat target surface, for example, to a sawtooth pattern, or threaded in the case of a cylindrical target will allow cathodic arc action to emit vapors more directly in a forward direction toward the product being coated resulting in a substantially increased coating rate. On a standard flat surface, a major fraction of vapors are ejected within about a 20° angle to the surface of the target and consequently a large amount is wasted to the sidewalls. The patterned surface reduces this vapor ejection toward sidewalls and channels a majority of vapor flux nearly perpendicular to the target surface and toward the substrate(s). This results in further reduction in wall deposits, which in turn, increases plating/coating rates, results in less waste, less waste disposal, less downtime and less maintenance. Initial measurements of wall deposits have shown a reduction from about 60% of the vaporized material to less than 25% of the vaporized material and further improvements may be possible with further optimization of the target surface patterns. The sawtooth design also acts to increase the surface area of the target for a target of the same outside width and length. The increased surface further increases the deposition rate. In fact, tests conducted for this design have shown deposition rate increase as much as eight times (8×) as compared to non-patterned flat surfaces. The sawtooth surface allows the substrate location to be at a greater distance from the target and thus allows uniform deposition on larger substrate (s) areas, further improving process economics.

The present invention employs a design of an anode/cathode packaging scheme in which both the anode and cathode are packaged within one physical unit without having to employ the chamber body to act as an anode. This packaging scheme eliminates the need to use the chamber walls as an anode (usually at ground potential) as was done with prior art. The employment of a separate packaging scheme allows the anode to be physically packaged with the cathode. The main embodiment of the present invention deploys a standard cathode with an air gap between the cathode and a ceramic (or other insulator material) backing surrounding the back of cathode/target not facing substrates. In the proposed anode/cathode packaging design of the present invention, the ceramic acts both as support to the anode and insulation from the cathode. The ceramic will thus create a further insulated gap and a metal will form the anode backing behind the ceramic. The gap location is perpendicular to the planar surface, the plane being that formed by the target surface and the insulator surface, such that the gap space would represent a split in the planar surface described. The gap located in this area prevents the arc from moving over the edge of the target. The ceramic (or other insulating material) thus has a metal backing (anode) attached directly to itself. Thus the metal backing creates the anode rather than the chamber wall. This arrangement keeps the arc on the surface of the target by way of the gap created between the target and the ceramic. An alternate embodiment of the present invention is to have a configuration of construction with no insulating ceramic between the anode and the cathode target but only an air spaced gap. In this arrangement, the gap itself is the insulator and is created between the anode and the cathode.

By utilizing this packaging design of the present invention, the chamber walls may not require cooling or as much cooling which, in turn, may lead to further improved reliability and lower cost of maintenance.

The present invention also utilizes an adjustable insulator apparatus (ceramic backing or other material) to adjust the target to insulator surface distance as the target erosion surface depletes (wears). The backing can be adjusted in order to facilitate even target wear over the entire target surface. The adjustment is done such that the insulator is backed off (or lifted away) such that there is a "distance" measured that is greater than zero from the extended plane of the wear surface on the target and the plane of the edge of the insulator that is parallel to the aforementioned target plane. Thus the plane of the insulator is be moved such that there is a positive distance between the insulator plane and the parallel plane of the target surface when using the insulator plane as a reference point. If the backing is left in place, the above mentioned "distance" becomes negative. That is, the extension of the plane of the target surface would intersect the side of the insulator and the target would eventually form a divot or concave surface inward from its outer edge. This is a known problem in the prior art. Also, excessive deposition occurs at the gap between the target edge and the insulator due to build-up of deposition material. As the build-up of deposition material quickly decreases the gap, a short eventually occurs and the arc destroys the insulator. The adjustment of the insulator provides even erosion of the target, less maintenance, greater reliability and less cost. Simple setscrews or shims are used to manually adjust the "distance" periodically to maintain a positive value. It should be noted here that the width of the gap perpendicular to the target erosion surface can vary substantially and is material dependent when considering arc crossover to insulation backing.

The present invention also utilizes a low frequency, pulsed current power supply for pulsing the arc current. It has been found by experimentation that a pulsed arc deposition reduces the droplet (macro particle) emission and thus decreases the roughness of the surface. Testing has been performed with up to 300 amperes of current with over a 50% duty cycle at 300 hertz. Pulsing of currents over 300 amperes may present a more optimal process but has not been tested as of the writing of the present invention. Pulsing of the arc current can be implemented with the toggle switching of current. Consideration should be given in the design to insure that the frequency of current pulsing is higher than the frequency of current toggling.

The present invention also allows for employment of various cathode construction schemes as follows:

1. A cylindrical cathode which could be placed within a tube for internal tube coating or for coating parts suspended around the cathode whereby the vacuum chamber forms a cabinet enclosing the parts of the cathode.
2. A doughnut or cylindrically shaped cathode that could be placed around a tube for external coating of a tube (or pipe) shaped object. The object to be coated could be drawn through the cathode for continuous plating.

The above mentioned anode/cathode packaging, current toggle switching, low frequency pulsed arc switching, insulator backing adjustment, and the non-mechanical striker, patterned cathode surface, various shaped cathodes, etc. all add to a cathodic arc deposition design with advantages over the prior art such as was previously stated. These include:
   a) even wear of the target;
   b) improved coating uniformity on the product;
   c) less macro particle deposition;
   d) faster deposition rates, thus faster cycle times for product production;
   e) improved reliability;
   f) less maintenance;
   g) less equipment cost; and
   h) the many other advantages as mentioned in discussions above.

BRIEF DESCRIPTION OF THE DRAWINGS

FIGS. 9, 9A, 9B is an illustrative drawing of an alternate embodiment depicting a ring or doughnut shaped cylindrical cathode.

FIGS. 10A, 10B is an illustrative drawing of another configuration of a ring or doughnut shaped cylindrical cathode with an elongated size to accommodate larger substrates and additional current switching cathode terminals.

Before explaining the disclosed embodiment of the present invention in detail, it is to be understood that the invention is not limited in its application to the details of the particular arrangement shown, since the invention is capable of other embodiments. Also, the terminology used herein is for the purpose of description and not of limitation.

DETAILED DESCRIPTION OF DRAWINGS

Figure 1:
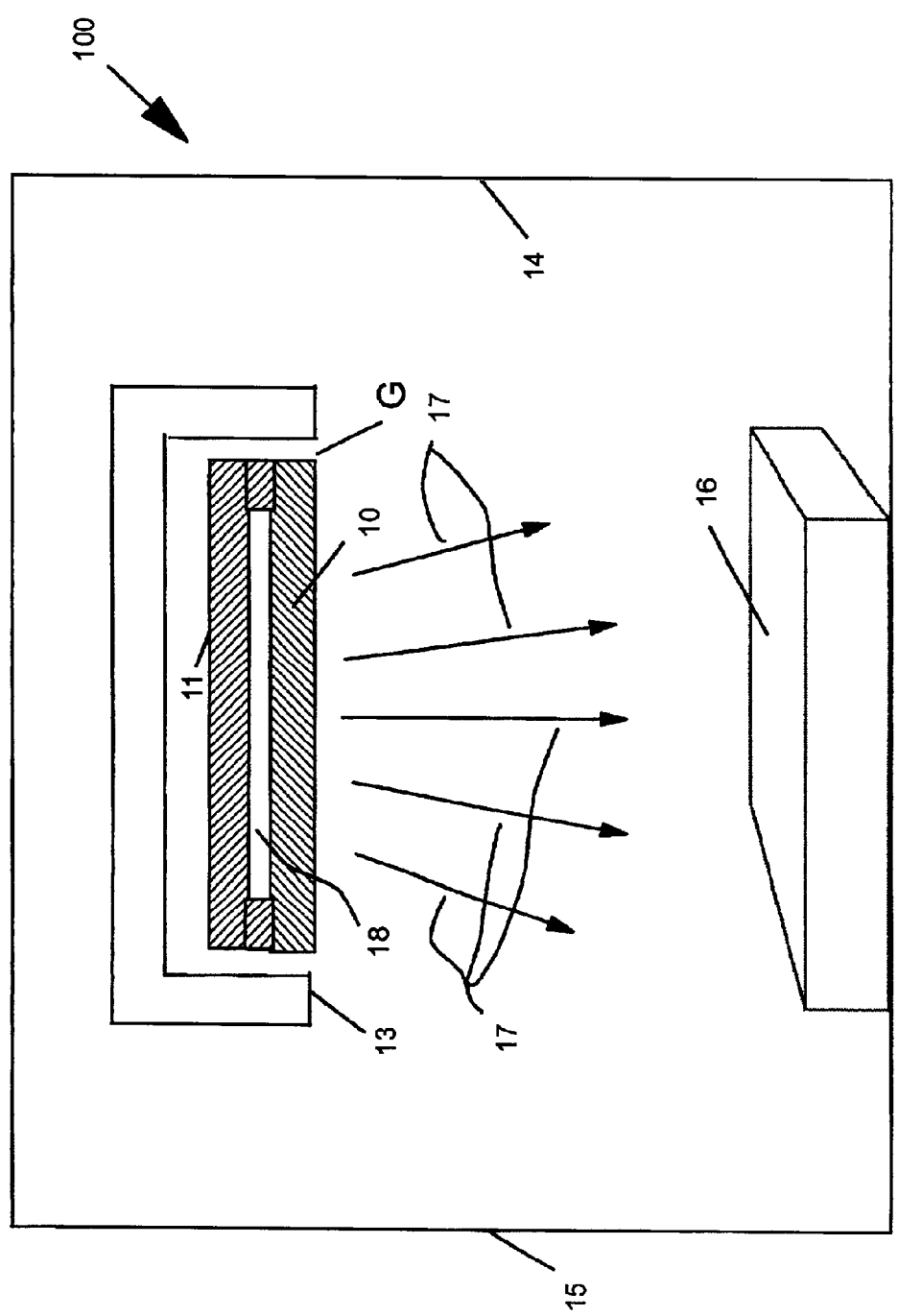
FIG. 1 is a simple cross-sectional view showing an illustration of a chamber assembly for cathodic arc deposition.

FIG. 1 is a cross-sectional view showing a relatively simple illustration of a vacuum chamber assembly 100 for cathodic arc deposition. Rectangular shaped target 10 of material to be deposited is attached to a cathode 11. It should be noted that although a rectangular shaped target is shown, other flat shapes such as oval shapes could be used. The cathode 11 is separated from insulator 13 by an air gap G. In cathodic arc apparatus of prior art, the chamber walls were used as the anode. The main embodiment of the present invention also uses the chamber wall 15 as the anode. A substrate 16 (object to be plated) is located within the chamber 15. Once the cathodic arc process is activated, a vapor stream 17 is initiated and material is deposited onto the substrate 16. A cooling channel 18 is located between cathode 11 and target 10 for cathode/target cooling purposes. Cooling channel 18 can be filled with moving liquid (water i.e.). Electrical contacts to the cathode and anode are not shown but are shown and described in FIGS. 2, 3 below. Further details will be shown in the figures that follow. Although the above packaging of FIG. 1 was described using the chamber wall as the anode, other packaging schemes will be described below in other figures (FIGS. 7, 8, 16) using a separately packaged anode.

Figure 2:
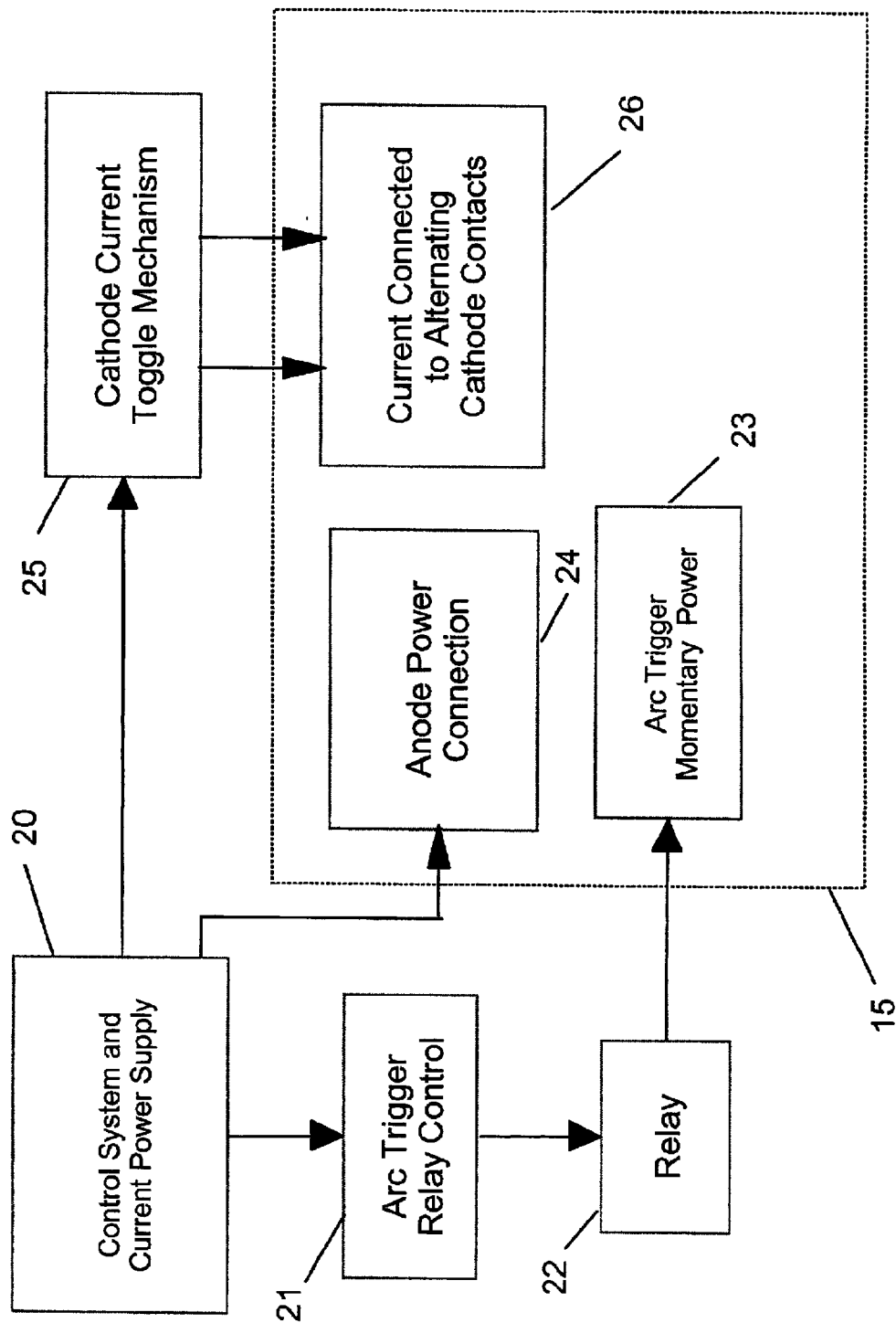
FIG. 2 is a schematic illustration of the power and controls system for the apparatus of the present invention.

FIG. 2 is a schematic illustration of the power and controls system for the apparatus of the present invention. A power supply and control system 20 is used for start-up, current level control, arc initiation, and process control. A positive voltage (more positive than the cathode) is applied to the anode connection 24. The anode may itself be at ground level and the cathode at a negative voltage. An alternative, not shown, is that the chamber may be used as the anode and grounded. An arc trigger control 21, initiated by the control system 20, supplies momentary power to relay 22. The relay 22 is momentarily activated which grounds the arc trigger 23 as previously described. The arc trigger initiates the arc. The control system 20 also supplies input power to the cathode current toggle mechanism 25. The cathode current toggle mechanism switches current from one alternating toggle location to another in the cathode areas 26. As described in the previous embodiment of the present invention, there will be two or more cathode areas that will receive switched current. The present invention provides for the control system 20, the arc trigger relay control 21, the relay 22 and the cathode current toggle mechanism 25 to all be located outside of the chamber 15. The present invention also provides for control system 20 to employ utilization of a low frequency pulsed current. It has been found by experimentation that a pulsed arc deposition reduces the droplet (macro particle) emission and thus decreases the roughness of the surface.

Figures 3, 3A:
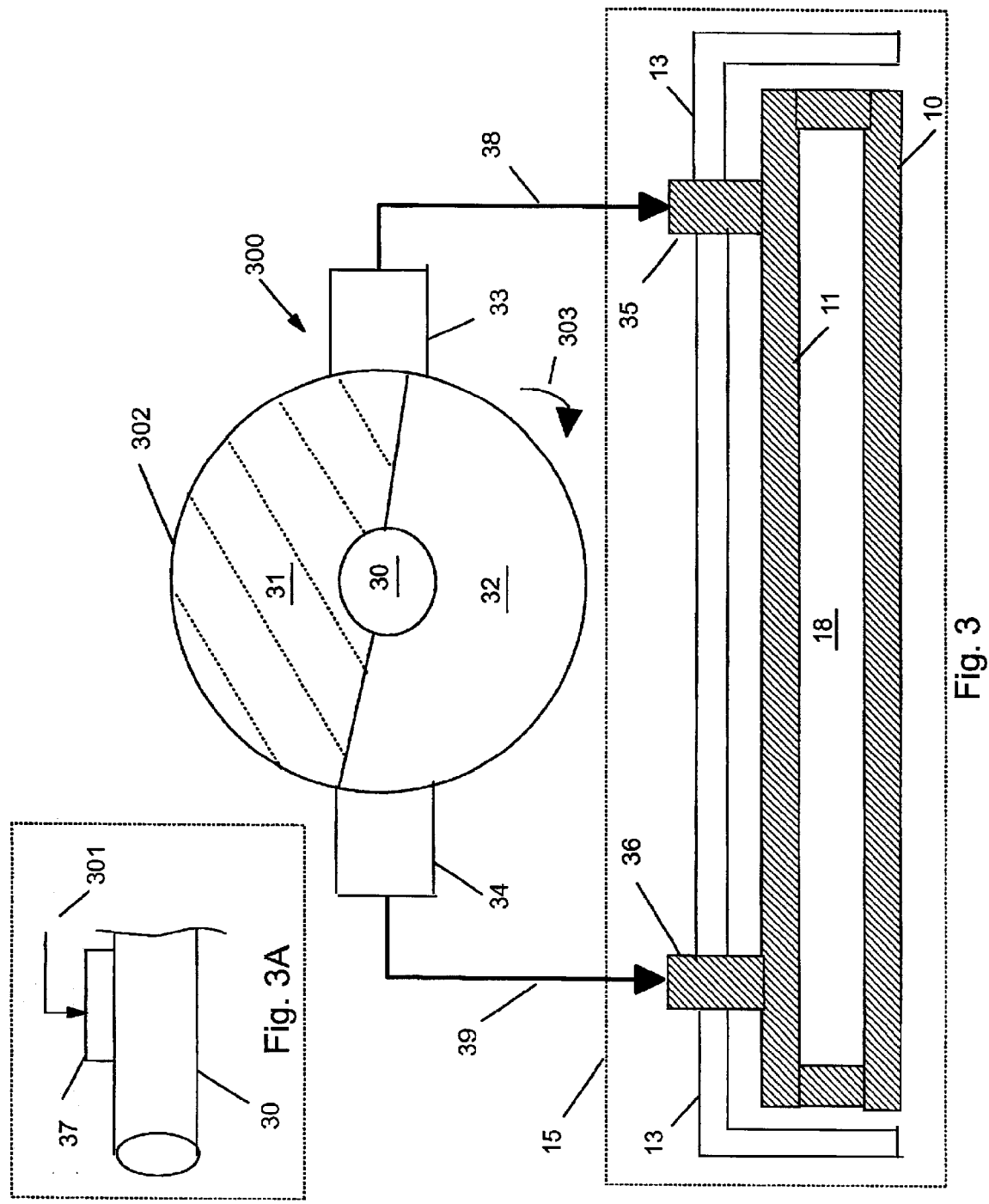
FIG. 3 is a cross-sectional drawing of a cylindrical shaped current toggle mechanism.
FIG. 3A is an insert side view depicting the cylinder shaft.

FIG. 3 is a cross-sectional drawing of a cylindrical shaped current toggle mechanism 300 and FIG. 3A is an insert side view depicting cylinder shaft 30, which is conductive. The cylindrical toggle mechanism 300 is constructed to route cathode input power 301 (FIG. 3A) from the control system power supply 20 to the cylinder shaft 30. Cylinder shaft 30 extends beyond the cylinder length and is connected to power input 301 by means of a conductive brush 37 which is located outside the cylinder length. As such, continuous contact is made between cathode input power 301 and the cylinder shaft 30. It should be noted that cathode input power 301 can easily be extended to multiple input points to cylinder shaft 30. It should also be noted that input power could be applied (i.e. a stationary brush) to the rotating flat surface of conductive volumetric area 32 (not shown). Cylinder 302 consists of the cylinder shaft 30 (which is extended beyond the cylinder itself), a non-conductive volumetric area 31, and a conductive volumetric area 32. The conductive volumetric area 32 is both mechanically and electrically connected to the cylinder shaft 30. The nonconductive volumetric area 31 can be "air" or can be filled with a high density insulating material to offset the weight balance of the cylinder. Brushes 33, 34 come into contact with conductive volumetric area 32 which is somewhat larger than half the cross-sectional area to insure contact with one or both brushes at any moment in time. As the cylinder 302 rotates 303, the design will insure that one contact, brush-A 33, remains active as the second contact, brush-B 34, makes contact, with some overlap, in order to avoid an "infinite" load being presented to the power system current source. Brush-A 33 is electrically connected by current conductor wire-A 38 through the chamber wall (feed-through) to cathode area-A contact 35. Likewise, brush-B 34 is electrically connected by current conductor wire-B 39 through the chamber wall (feed-through) to cathode area-B contact 36. In this manner, current is "toggled" between the two cathode 11 contacts to switch the current to different cathode areas. It should be noted that cylindrical toggle mechanism 300 is located outside chamber 15 and requires only pass-through of current conductors 38, 39. Although only two cathode contact areas are shown, it also should be noted that further designs (not shown) could be employed to switch to more than two cathode areas. The frequency of rotation of cylindrical toggle mechanism 300 controls the current switching speed. Rotation speed of the cylinder can be controlled by such means as a variable speed motor driving the shaft directly, or connected to the cylinder (or shaft) by a gear mechanism, or other means.

Figure 4:
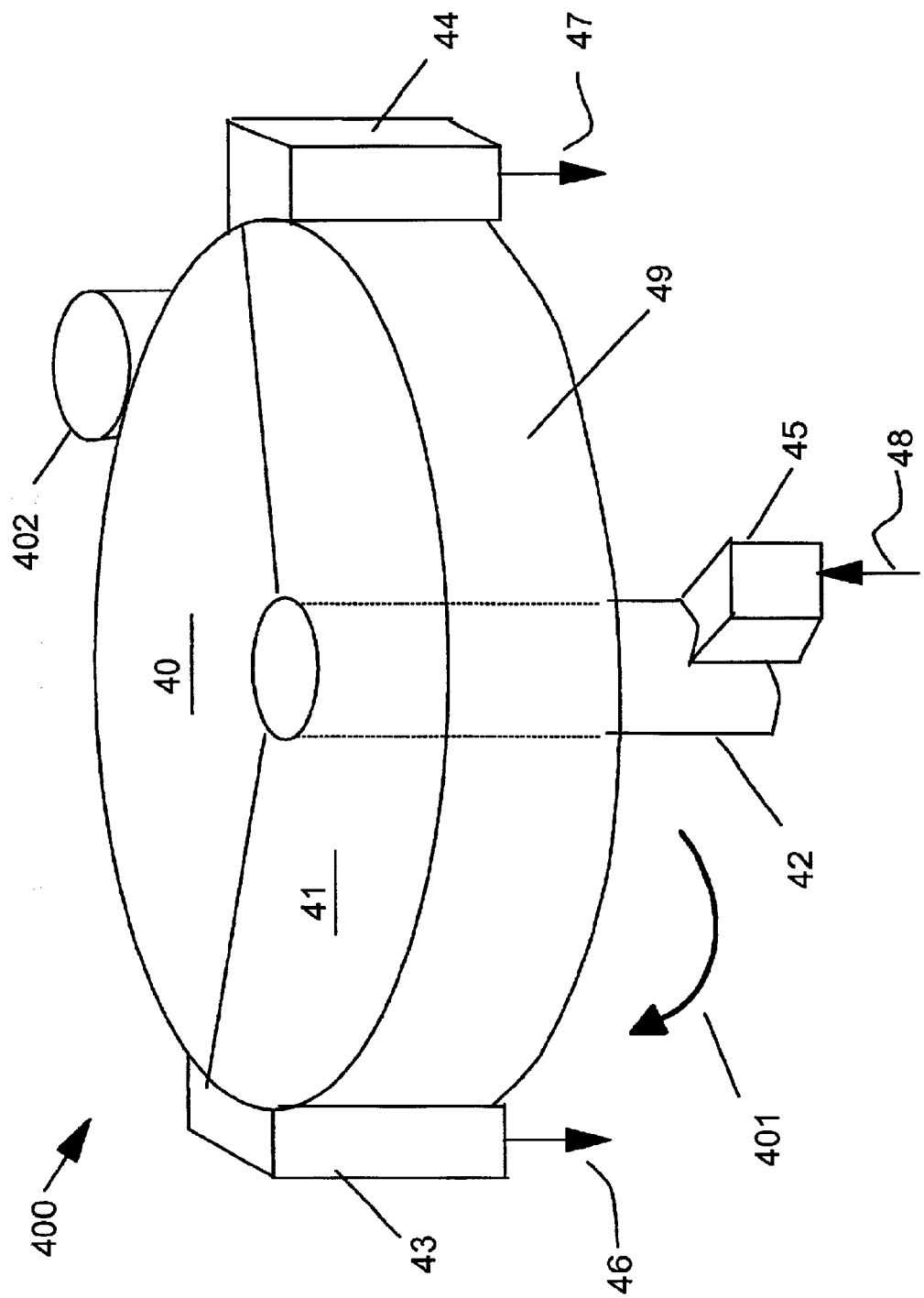
FIG. 4 is a top perspective view depicting an illustrative drawing of an alternate embodiment of the present invention, a disk shaped current toggle mechanism.

FIG. 4 is top perspective view depicting an illustrative drawing of an alternate embodiment of a current switching mechanism, a disk shaped current toggle mechanism 400, which is similar to the cylindrical mechanism described in FIG. 3. Input power 48 from control system and current power supply 20 is connected to shaft brush 45, which in turn, is connected to rotating shaft 42. Rotating shaft 42 is conductive and hard connected (mechanically and electrically) to conductive volumetric area 41 of disk current toggle mechanism 400. As the disk rotates 401, the design will insure that one contact, brush-1 43, becomes active just prior to the second contact, brush-2 44, becoming non-active in order to avoid an "infinite" load being presented to the power system current source. Brush-1 43 is electrically connected by current conductor wire-1 46 through the chamber wall (feed-through) to a cathode area-1 contact (not shown). Likewise, brush-2 44 is electrically connected by current conductor wire-2 47 through the chamber wall (feed-through) to cathode area-2 contact (not shown). In this manner, current is "toggled" between two separate cathode contacts to switch the current to different cathode areas. It should be noted that disk toggle mechanism 400 is located outside chamber 15 and requires only pass-through of current conductors 46, 47. It also should be noted that further designs (not shown) can be employed to switch to more than two cathode areas. The frequency-of rotation of disk toggle mechanism 400 controls the current switching speed. Rotation speed of the cylinder can be controlled by such means as a variable speed motor driving the shaft directly, or connected to the cylinder (or shaft) by a gear mechanism or other means. In FIG. 4, gear drive 402 is shown, which is attached to the cylinder for rotational speed control. A gear drive could also be attached to shaft 42.

It should be noted that other mechanisms of FIGS. 3, 4 could also be designed such that the brushes 43, 44 contacting the disk 49 (FIG. 4) or the brushes 33, 34 contacting the cylinder 302 (FIG. 3) could be rotated about the disk or cylinder. In such a design, the disk or cylinder could remain stationary.

Figure 5:
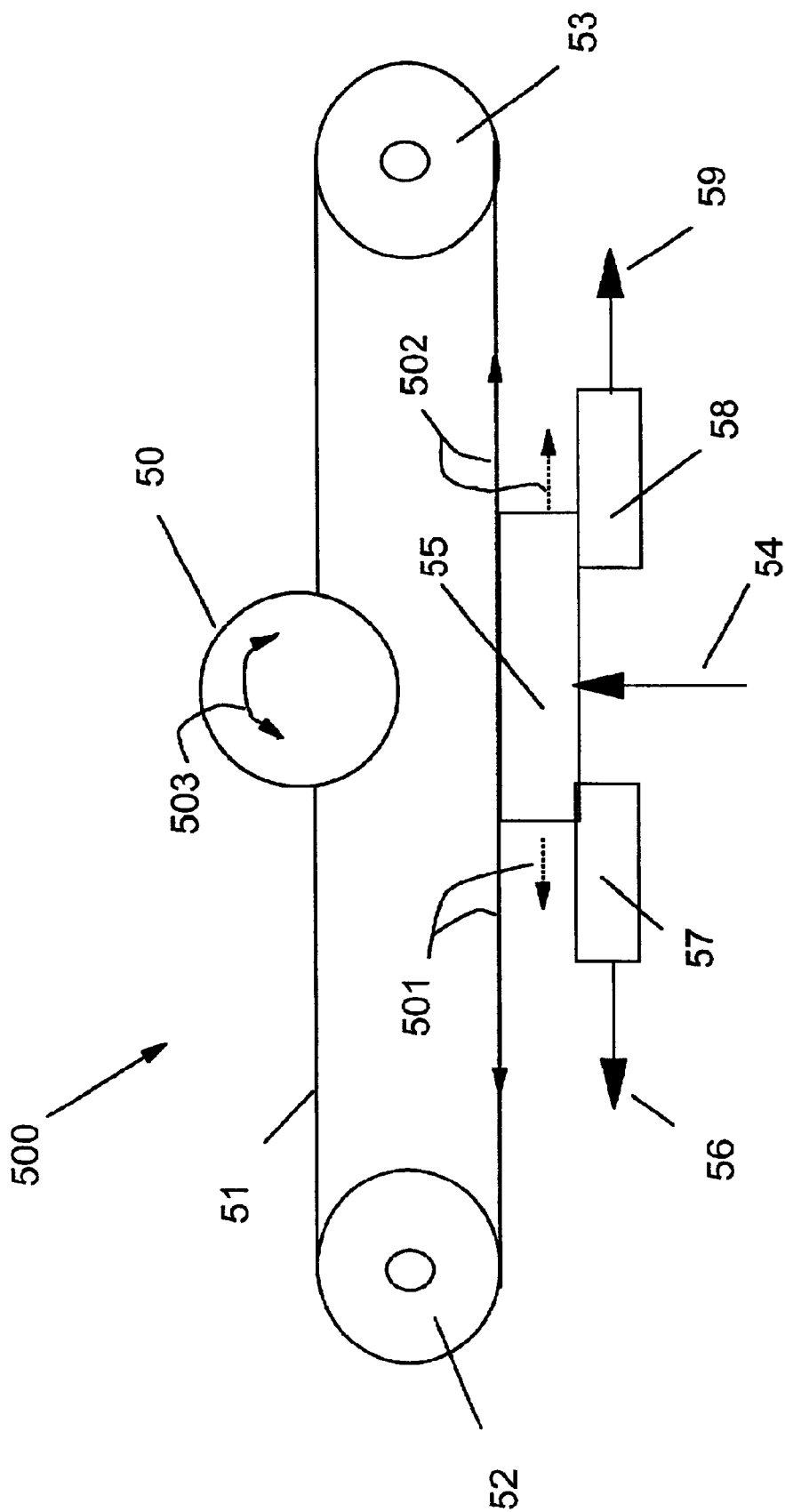
FIG. 5 is cross-sectional drawing of yet another alternate embodiment of the present invention, a reciprocating motion current toggle mechanism.

FIG. 5 is a cross-sectional drawing of yet another alternate embodiment of the present invention, a reciprocating motion current toggle mechanism 500. In this embodiment a toggle motor 50 is attached to belt 51. The toggle motor moves belt 51 in alternating clockwise and counter-clockwise directions 503. Belt 51 is wrapped about a left pulley 52 and a right pulley 53. As the toggle motor 50 rotates back and forth in alternating clockwise and counterclockwise directions 503, belt 51 reacts with reciprocating lateral movements 501, 502. A belt conductive block 55 is directly connected to belt 51 and is also connected to control system power supply 20 through an electrical wire connection 54. Movement of belt 51 causes reciprocating lateral movements 501, 502 of belt conductive block 55. Conductive block 55 alternately makes contact with stationary conductive blocks 57, 58 such that there is a momentarily overlap of contact with conductive block-A 57 and conductive block-B 58 during motion. Conductive blocks A/B are, in turn, connected to separate cathode area connectors (not shown) via wire connectors 56, 59 which pass through chamber wall 15. As belt conductive block 55 moves in a reciprocating motion, the design will insure that one contact, block-A 57, becomes active just prior to the second block-B 58, becoming non-active in order to avoid an "infinite" load being presented to the power system current source. Control of toggle motor 50 frequency (clockwise/counter-clockwise motion change) controls the reciprocation frequency of belt conductive block 55 and thus controls the current switching frequency to the cathode. Although not shown, the design could easily be extended to have multiple inputs and/or multiple outputs.

Figure 6:
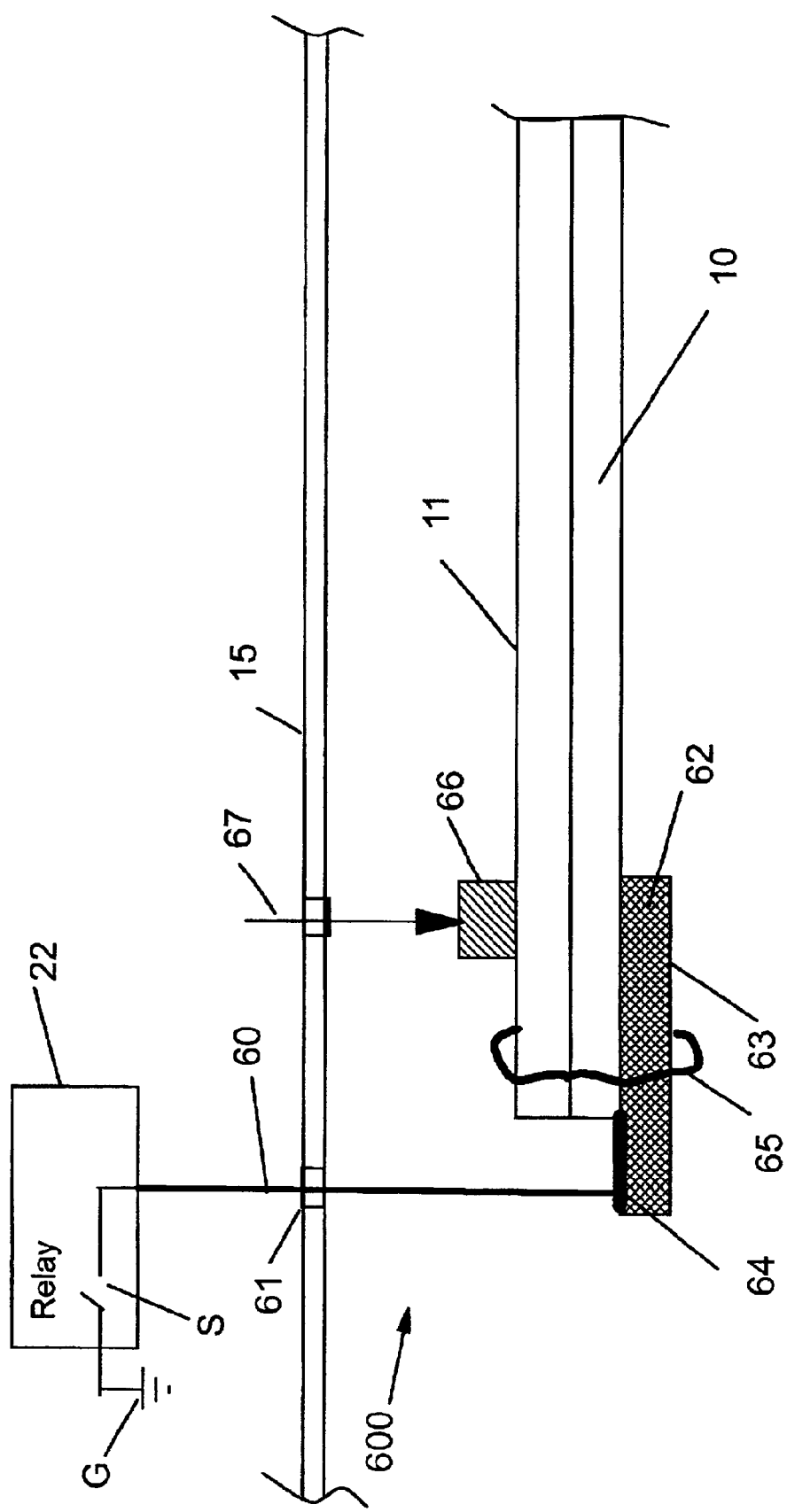
FIG. 6 is a cross-sectional drawing of a non-mechanical arc striker to initiate an arc.

FIG. 6 is a cross-sectional drawing of a non-mechanical ceramic (or other insulator material capable of being metallically plated) arc striker 600 to initiate an arc. Ceramic striker 600 consists of a small diameter or thin ceramic block 62, which is pre-plated with a thin metallic film 63 and attached directly into contact with the target 10, which is attached to cathode 11. Cathode 11 is kept electrically active by connecting cathode contact 66 to current conductor 67, which receives a current from control system 20 as previously described. A clip 65 or other means is used to hold the ceramic block into place. Contact lead 60 is routed through insulated feed-through hole 61 of chamber 15 and is connected to conducting contact 64 which is then attached to one end of the plated ceramic striker 600. The other end of the contact lead 60 is then grounded through a normally "open" switch S controlled by a relay 22. When a timed control power is applied to the relay coil, it is momentarily activated and switch S closes. A current of approximately 10 amps is instantaneously drawn through the thin metallic film 63 plated on ceramic striker 600 and results in arc initiation. The momentary high current that initiates the arc may vaporize the thin-coated plating away from striker 600. Ceramic striker 600 will be re-plated by the target 10 material with the initiation and/or continuation of the arc during arc vaporization process. Thus, the ceramic striker 600 will be automatically re-electrically attached to target 10 and thus automatically made ready for the next future arc initiation. As stated earlier, there is no mechanical movement of striker 600, thus there are no moving parts or pneumatic devices required (reducing particle generation), no special or machined fixtures as it only uses off-the-shelf parts, no additional power supply, less controls which all result in both a lower cost and lower maintenance. It should be noted that a conductive ceramic could also be used in the place of aforementioned plated ceramic block 62.

Figure 7:
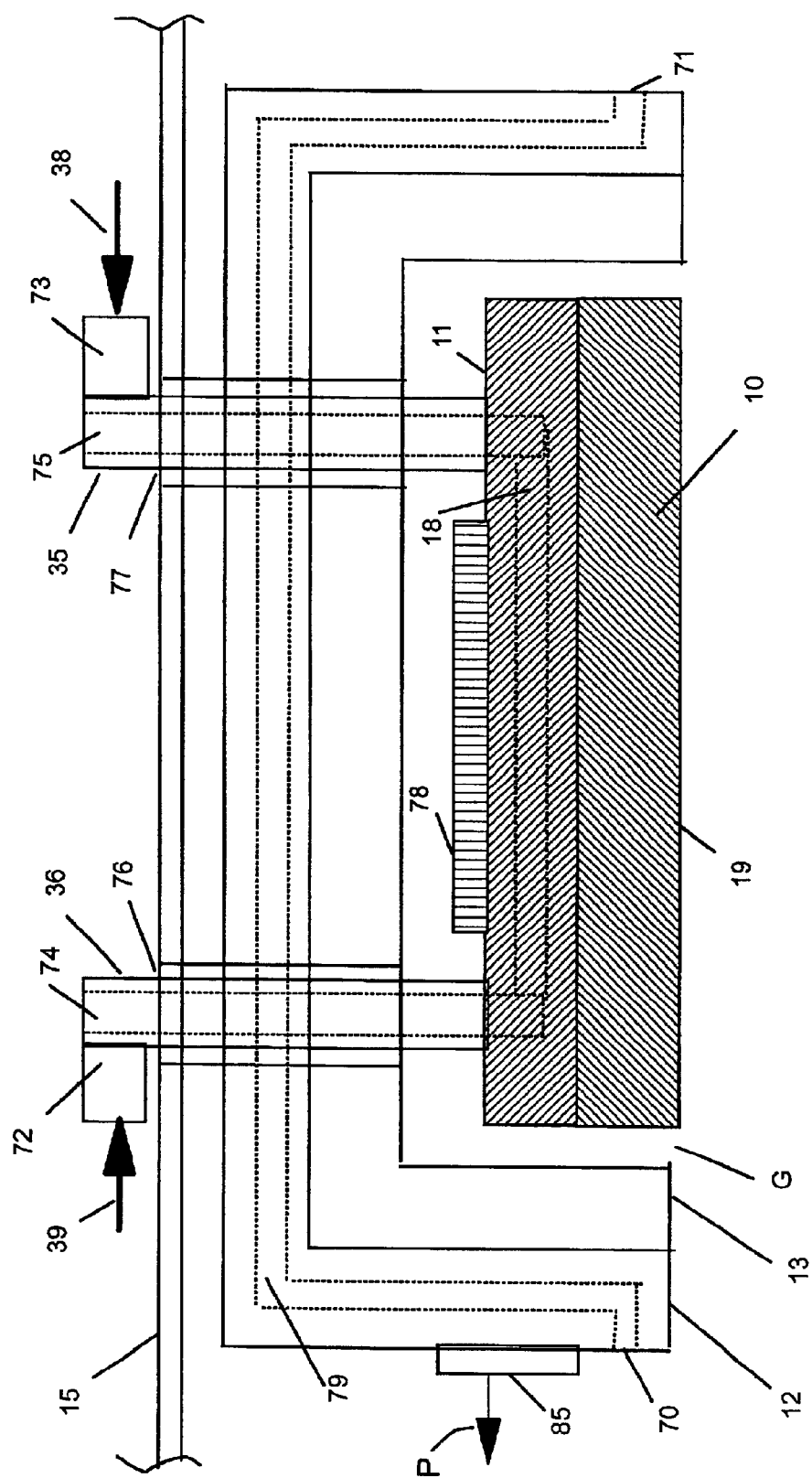
FIG. 7 is a cross-sectional drawing of the packaging scheme showing the anode packaged on the back of the cathode.

FIG. 7 is a cross-sectional drawing of the packaging scheme showing the anode 12 packaged on the back of the cathode 11. This packaging scheme eliminates the need to use the chamber walls 15 as an anode (usually at ground potential) as was done with prior art. The employment of this packaging scheme allows the anode 12 to be physically packaged with the cathode 11 and employs an air gap G between the cathode insulator 13 which acts both as support to the anode 12 and insulation. Insulator 13 (ceramic or other insulating material) thus has a metal backing (anode 12) attached directly, which acts as an anode rather than the chamber wall. This arrangement keeps the arc on the surface of target 10 by way of the gap G created between target 10 and insulator 13. Gap G located as described and depicted prevents the arc from moving over the edge of target 10. Toggled current first enters from current conductor wire-B 39 which contacts cathode area-B contact 36 at terminal block-B 72. Alternately, current is switched to current conductor wire-A 38 which contacts cathode area-A contact 35 at terminal block-A 73. Insulating rings 76, 77 at each through point of the chamber provide insulation between chamber wall 15 and cathode area A/B contacts 35, 36 and anode 12. Cooling of cathode 11 and target 10 is accomplished with liquid cooling (water, e.g.) with cooling channel entrance 74 and cooling channel exit 75. Cooling liquid cools cathode 11 and target 10 via internal cathode cooling channel 18. Cooling of anode 12 is accomplished with liquid cooling using anode cooling entrance 70 and anode cooling exit 71 via internal anode cooling channel 79. Anode liquid cooling can exit or enter the chamber or anode at various points in a similar fashion to that described for cathode cooling. Employment of this packaging scheme will benefit in that the chamber walls 15 may not require cooling or as much cooling which, in turn, may lead to further improved reliability and lower cost of maintenance. Anode contact terminal 85 is connected to the positive polarity of power supply 20 via attached conductor lead P. An alternative is to connect anode contact terminal 85 to ground or the wall of chamber 15 depending on the design of the anode electrical contact scheme.

Also shown in FIG. 7 is an "optional" magnetic backing 78 on the backside of and in direct contact with cathode 11. On certain target materials, the addition of magnets (magnetic backing 78) alters the arc path and motion as compared to non-presence of a magnetic backing 78. There are various configurations of the magnet and placement.

An alternate embodiment (see FIG. 16 below) is to have a construction with no insulator 13 between the anode 12 and the target 10 but only air gap G. In this arrangement, gap G is the insulator.

Figure 8:
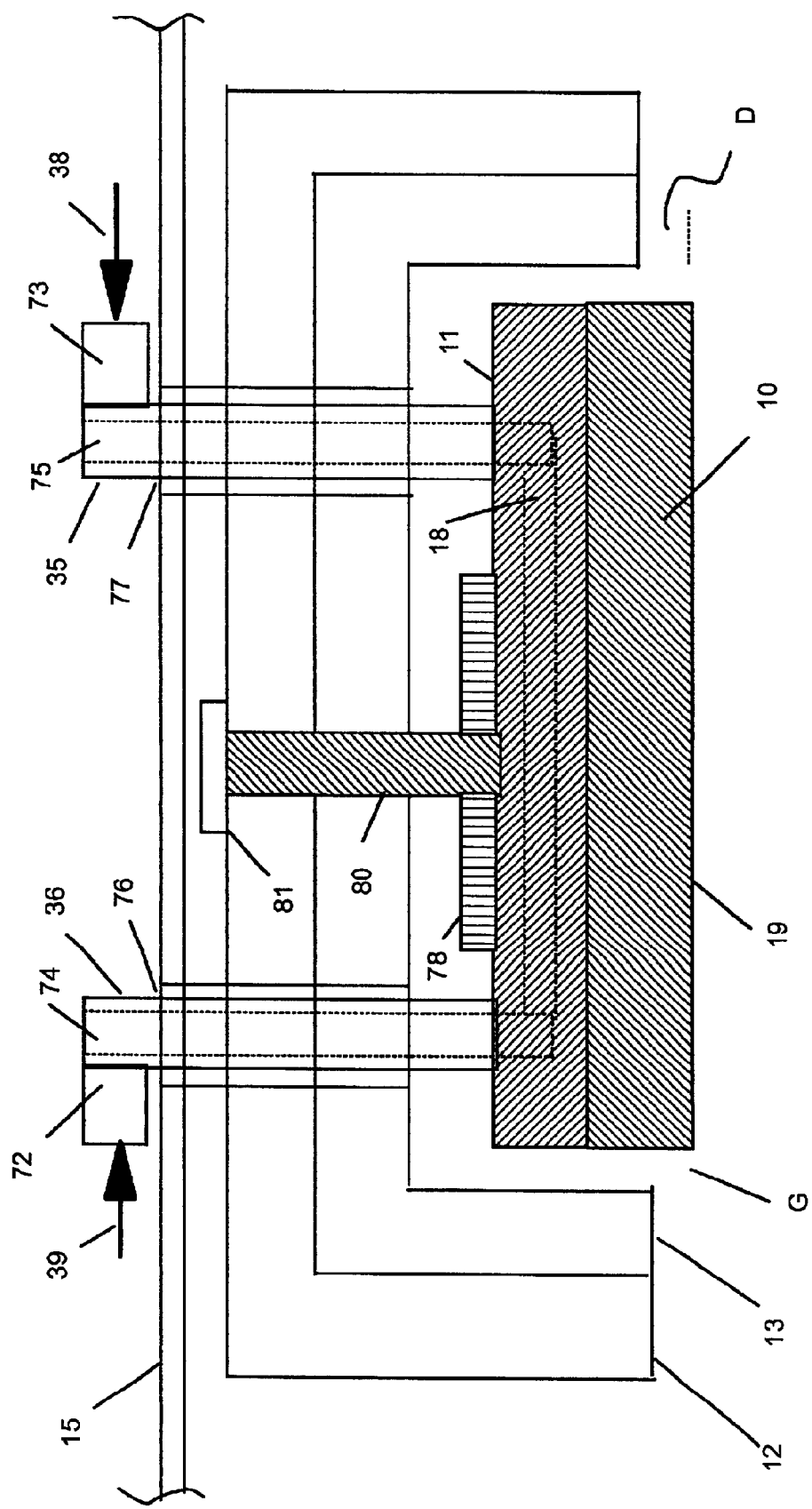
FIG. 8 is a cross-sectional drawing of an adjustable insulator as the target depletes.

FIG. 8 is a cross-sectional drawing of an adjustable insulator 13 as target 10 depletes during arc deposition. FIG. 8 is similar to FIG. 7 with the exception that an adjustable, electrically insulating screw 80 has been added. The anode 12 and insulator 13, which are attached to one another, is adjusted in order to facilitate even target wear over the entire target wear surface 19. The adjustment is done such that the insulator is backed off such that there is a "distance" D measured that is greater than zero when measured from the extended plane of the target wear surface 19 on target 10 and the plane of the edge of insulator 13 that is parallel to the aforementioned target plane. Thus the insulator 13 and anode 12 are moved by adjustment screw 80 by turning screw head 81 such that there is a positive distance D. If there is no adjustability, the anode/cathode are left in place and distance D becomes negative. In that case, the target wear surface 19 of target 10 eventually forms a divot or concave surface inward from its outer edge. Also, deposition material build-up occurs on edge of insulator 13 next to gap width G between the target 10 edge and the insulator 13 edge. As the build-up of deposition material decreases gap width G, a short eventually occurs causing the arc to touch insulator 13 frequently and finally destroy insulator 13. The adjustment of the insulator provides even erosion of target 10, less maintenance, greater reliability and less cost. Other means (not show) can be used to adjust distance D in order to maintain a positive value. Anode electrical connection and cooling channel is not shown (See FIG. 7).

It should be noted that adjustable insulation on the back of the cathode is also applicable to cathode without anode/cathode packaging as shown in FIG. 1.

FIGS. 9, 9A, 9B is an illustrative drawing of an alternate embodiment depicting a ring or doughnut shaped cylindrical cathode 900. FIG. 9 shows a frontal cross-sectional view of a ring or doughnut shaped cylindrical cathode 900. This alternate configuration allows for a substrate 94 to be plated on its outside surface when stationary or being moved through the cylindrical cathode 900. Alternating toggle switching of cathode current carried from the current switching mechanism (not shown) by wire-A 95 connected to cathode terminal-A 911 and from wire-B 96 connected to cathode terminal-B 910. Air gap 98 provides isolation between terminal-A 911 and terminal-B 910. Cooling liquid (water, e.g.) is cycled through cathode channel 97 via internal cathode cooling channel 99. Target 90 is on the internal cylinder surface and forming the inside of the cylindrical cathode 900 and surrounds substrate 94, to be plated. Cathode 91 is attached to ring or doughnut shaped cylindrical target 90. Air gap 92 separates cathode from insulator 93. FIG. 9A shows a side perspective view 901 of cylindrical cathode 900. FIG. 9B shows a cross-sectional view 902 depicting substrate 94 to be plated, target 90, cathode 91, air gap 92, and insulator 93, as well as internal cathode cooling channel 99.

FIGS. 10A, 10B is an illustrative drawing of another configuration of a ring or doughnut shaped cylindrical cathode with an elongated size to accommodate longer/larger substrates and to accommodate additional current switching cathode terminals. FIG. 10A shows an end cross-sectional view 1000 similar to FIG. 9 but with relocation of input terminals. FIG. 10B is a side cross-sectional view, which depicts four input terminals. Four input lead-in wires 1020, 1021, 1002, 1003 provide the toggling of the current from a current toggle switch device, which was previously described. Input wires are connected to four input terminals 1010, 1011, 1012, 1013, which are strategically located at various positions along cathode 91. Two liquid cooling entry ports 1004, 1006 and two cooling exit ports 1005, 1007 accomplish cooling of the cathode.

The ring or doughnut cylindrical arc cathode configurations depicted in FIGS. 9, 9A, 9B, 10A, 10B above may also be used to coat a moving substrate by pulling the substrate through the ring or doughnut.

Figure 11A:
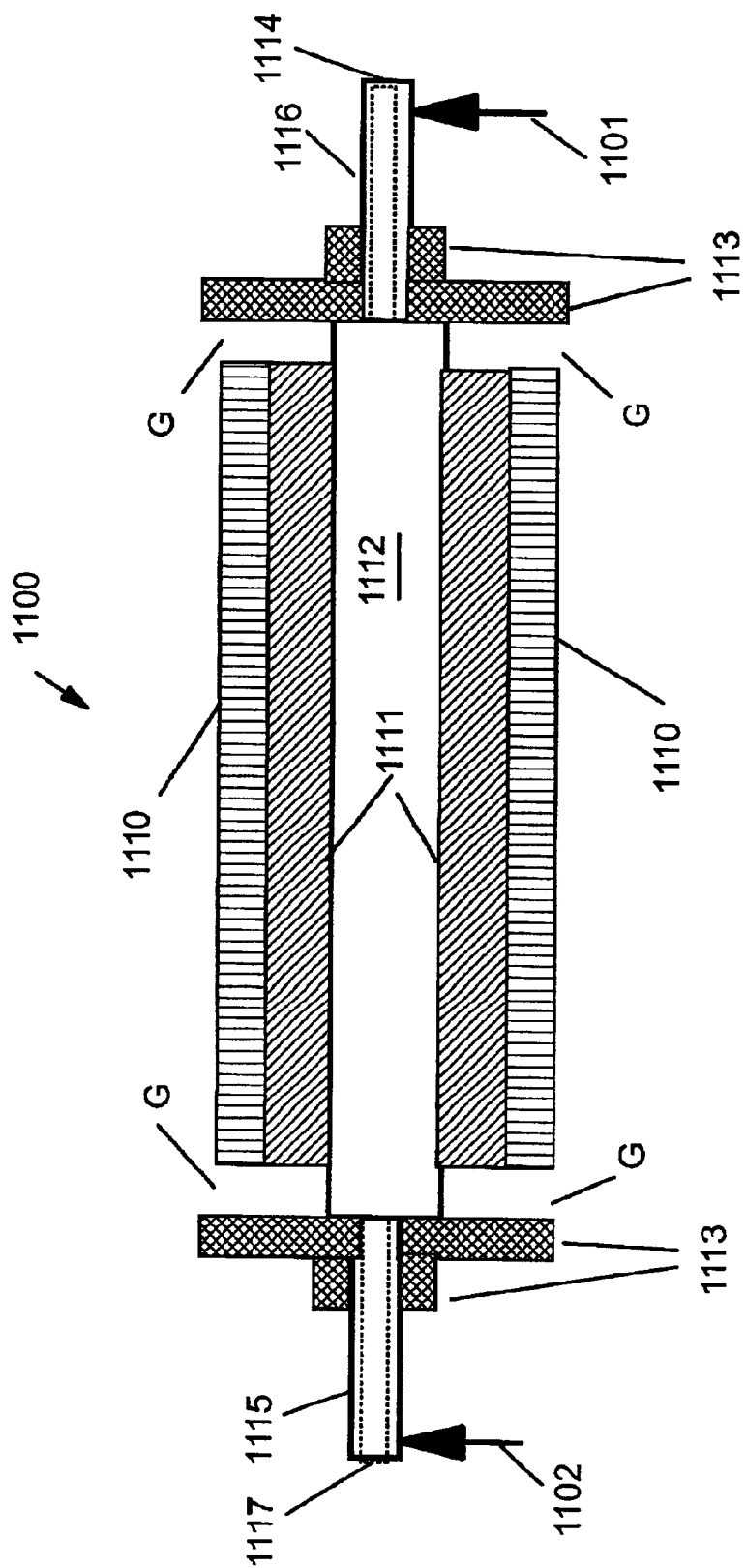
FIG. 11A is a side cross-sectional drawing showing another alternate embodiment of a cylindrical cathode for plating/coating substrates internally or suspended in a vacuum chamber.

FIG. 11A is a side cross-sectional drawing showing yet another alternate embodiment of a cylindrical cathode 1100 for plating/coating substrates internally or suspended in a vacuum chamber. Such a configuration can be utilized to plate the inside of a substrate, such as a tubular substrate. Current switching toggle wire inputs 1101, 1102 are connected to input terminals 1115, 1116 respectively. which are insulated from the chamber wall 15 (not shown), which acts as the anode. Cathode body 1111 and attached target 1110 are cylindrical in shape. Cooling liquid can enter through entry port 1117 and exit through cooling exit port 1114 as it flows through internal channel 1112. Gap G separates cathode 1111 from insulator 1113.

Figure 11B:
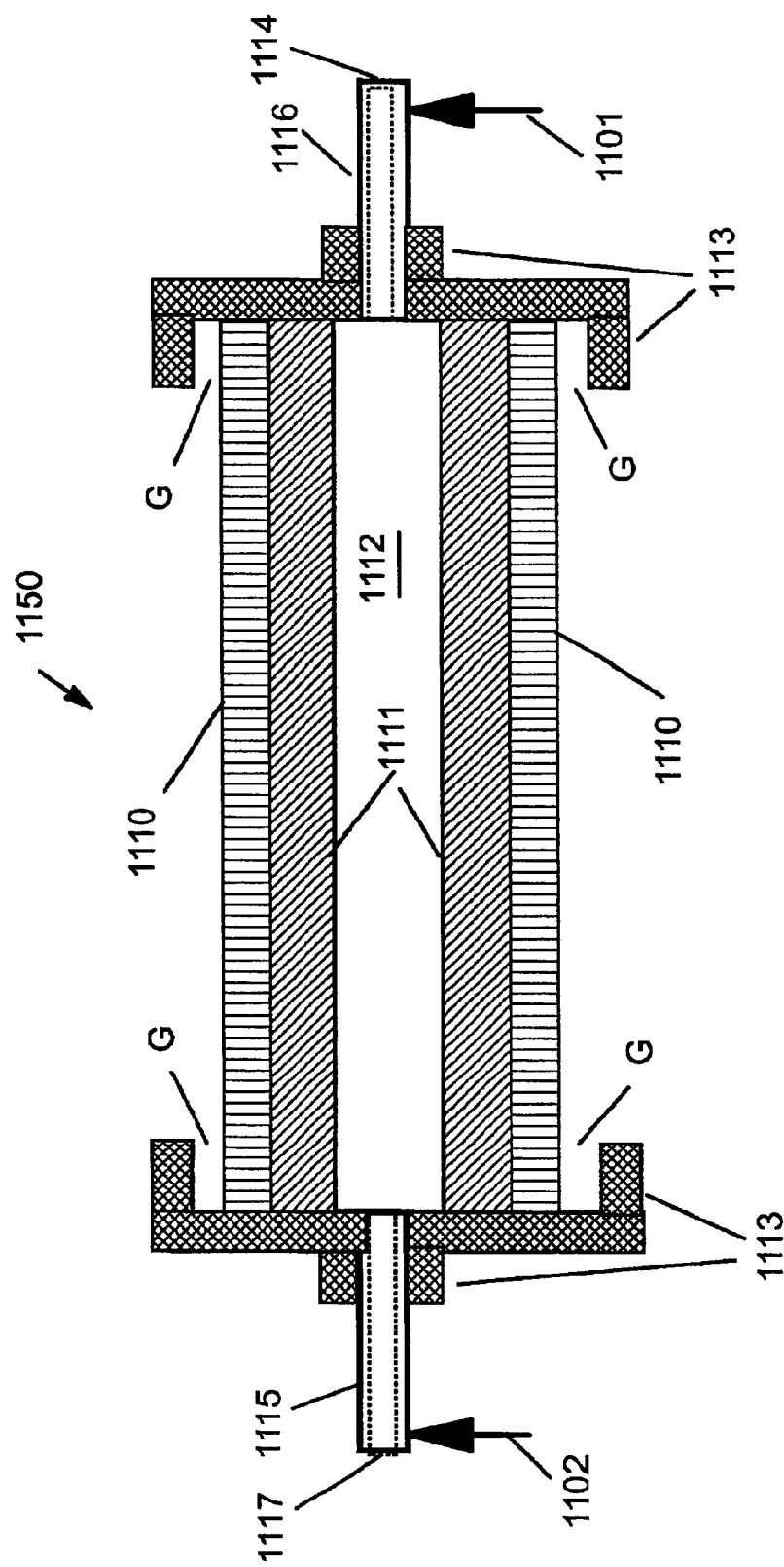
FIG. 11B is side cross-sectional view of an alternate embodiment of a cylindrical cathode similar to FIG. 11A but with the gap directed over the edge of the target surface.

FIG. 11B is side cross-sectional view of an alternate embodiment of a cylindrical cathode similar to FIG. 11A but with gap G directed over the edge of target 1110.

Figure 12A:
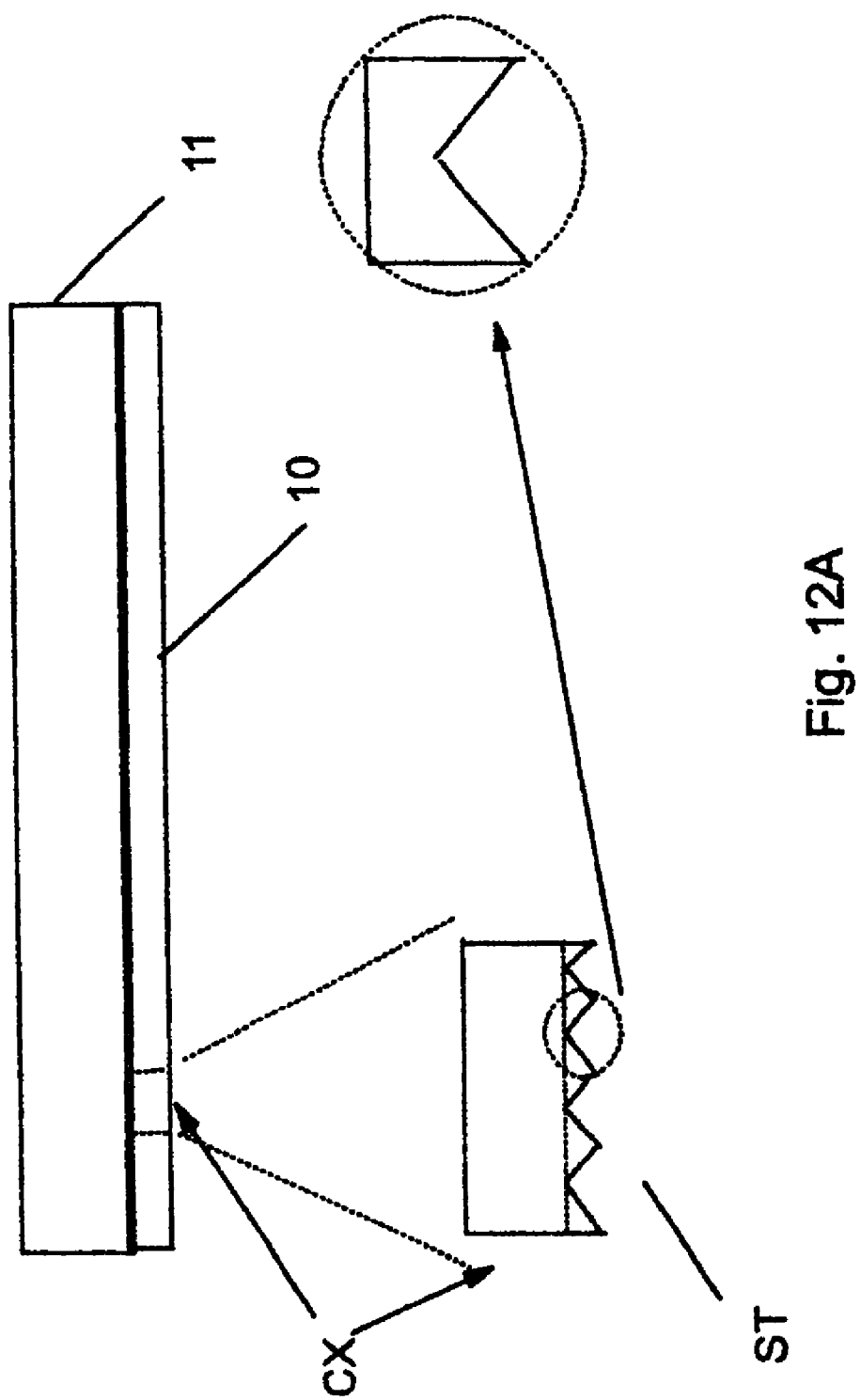
FIG. 12A is a side cross-sectional view of a patterned target surface for directing vapors towards the substrate to be plated.

FIG. 12A is a side cross-sectional view of a patterned target surface facing substrates for enhancing and directing vapor flux towards the substrate to be plated. Target 10 attached to cathode 11 is shown with a patterned surface. Cutout CX is expanded in size to show a sawtooth ST patterned surface on the target 10 material. Reshaping a standard flat target 10 surface to a sawtooth surface will result in cathodic arc action to emit and eject vapors at a substantially higher rate directly toward substrate(s) to be coated resulting in faster coating.

Figure 12B:
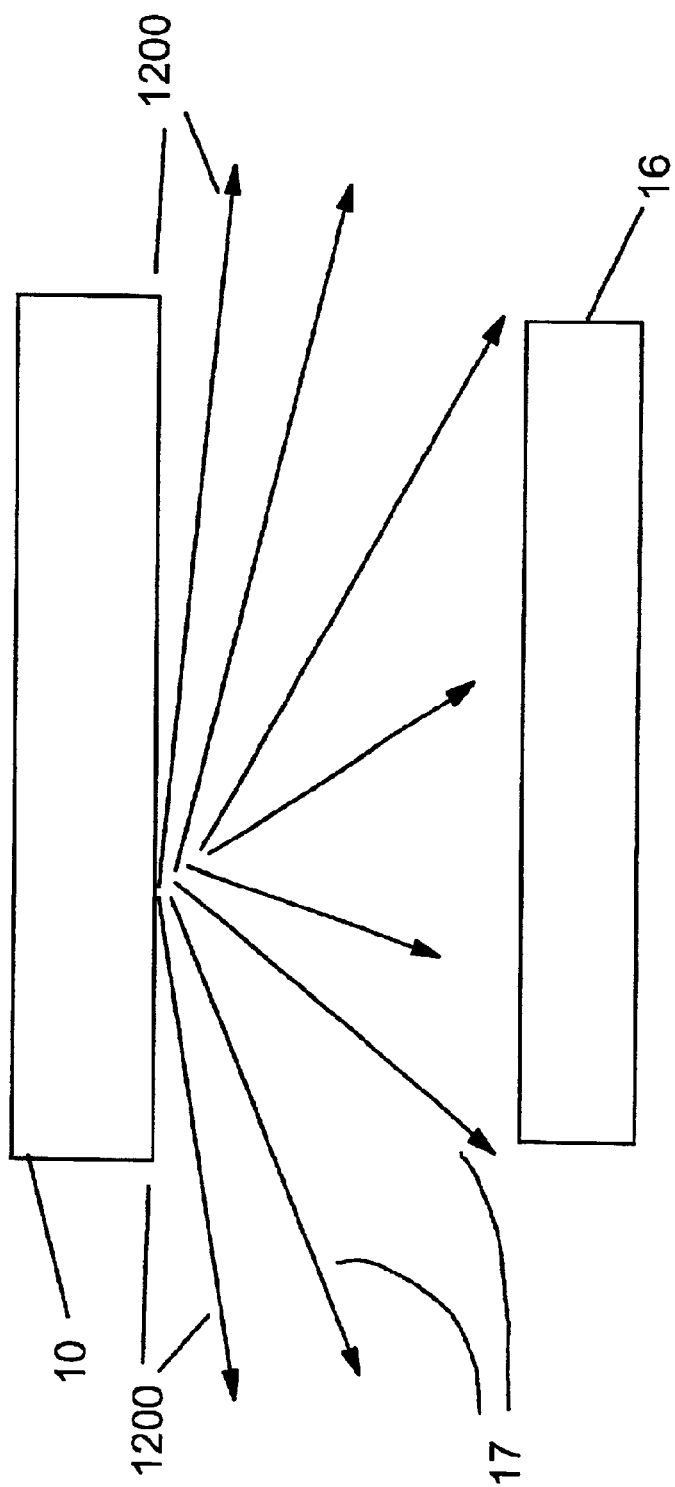
FIG. 12B is a side cross-sectional drawing of vapor emitting from a cathode spot on a target surface.

FIG. 12B is side cross-sectional drawing of vapor 17 emitting from a cathode spot on a target 10 surface. On a standard flat surface, a significant fraction of vapors 17 are ejected within about a 20° angle 1200 to the surface of the target and consequently a large amount is wasted to the sidewalls. The treated sawtooth surface on target 10 channels a substantial portion to be ejected in a forward direction towards the substrate and outside of the 20° angle 1200. This results in reduced wall deposits. Less wall deposits, in turn, result in less waste, less waste disposal, less downtime and less maintenance and increased plating/coating rates.

Further improvements in plating/coating rate and uniformity are possible with further optimization of the target 10 surface pattern (sawtooth or other). The sawtooth design acts to greatly increase the surface area of the target 10 for a target of the same outside width and length. The patterned area directs and increases the vapor 17 emission much more perpendicular to target 10. The sawtooth surface also allows substrate 16 location to be at a greater distance from target 10 and thus allows uniform deposition on larger substrate(s) surface areas, improving process economics.

In a similar manner (not shown) other surfaces can be treated to allow increased deposition rates and can be directed in a more focused manner towards the substrate. For example, the cylindrical targets described in FIG. 9 through FIG. 11B can be treated by creating a threadlike surface(s).

Figure 13:
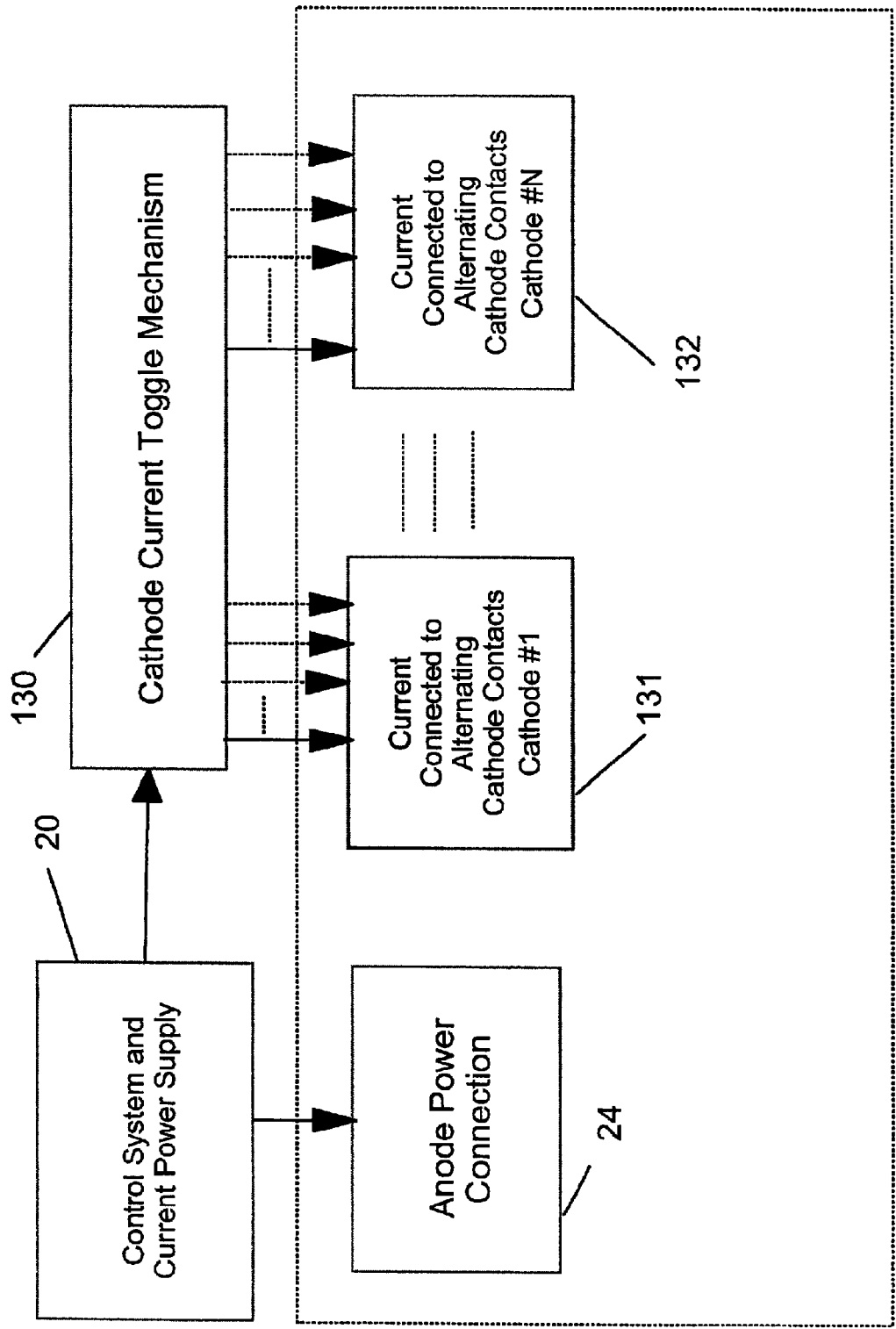
FIG. 13 is a schematic illustration of the power and controls system for the apparatus of the present invention consisting of multi-cathodes and multi-contact points.

FIG. 13 is a schematic illustration of the power and controls system for the apparatus of the present invention consisting of multi-cathodes and multi-contact points. FIG. 13 is an expansion of FIG. 2 to show multi-cathodes and contact points. Power supply and control system 20 is used for start-up, current level control, arc initiation, and process control. A positive voltage (more positive than the cathode) is applied to the anode connection 24. The anode may itself be at ground level and the cathode at a negative voltage. An alternative, not shown, is that the chamber may be used as the anode and grounded. The arc trigger control is not shown. Control system 20 supplies input power to the cathode current toggle mechanism 130. The cathode current toggle mechanism has the ability to employ multi-output current nodes. As depicted, one or more toggle switched current nodes can input one or more multi-locations in cathode 131 and also support additional outputs to a string of "N" cathodes (cathode "N" 132 is shown). Each of the "N" cathodes can have one or more toggle switched current inputs.

Figure 14:
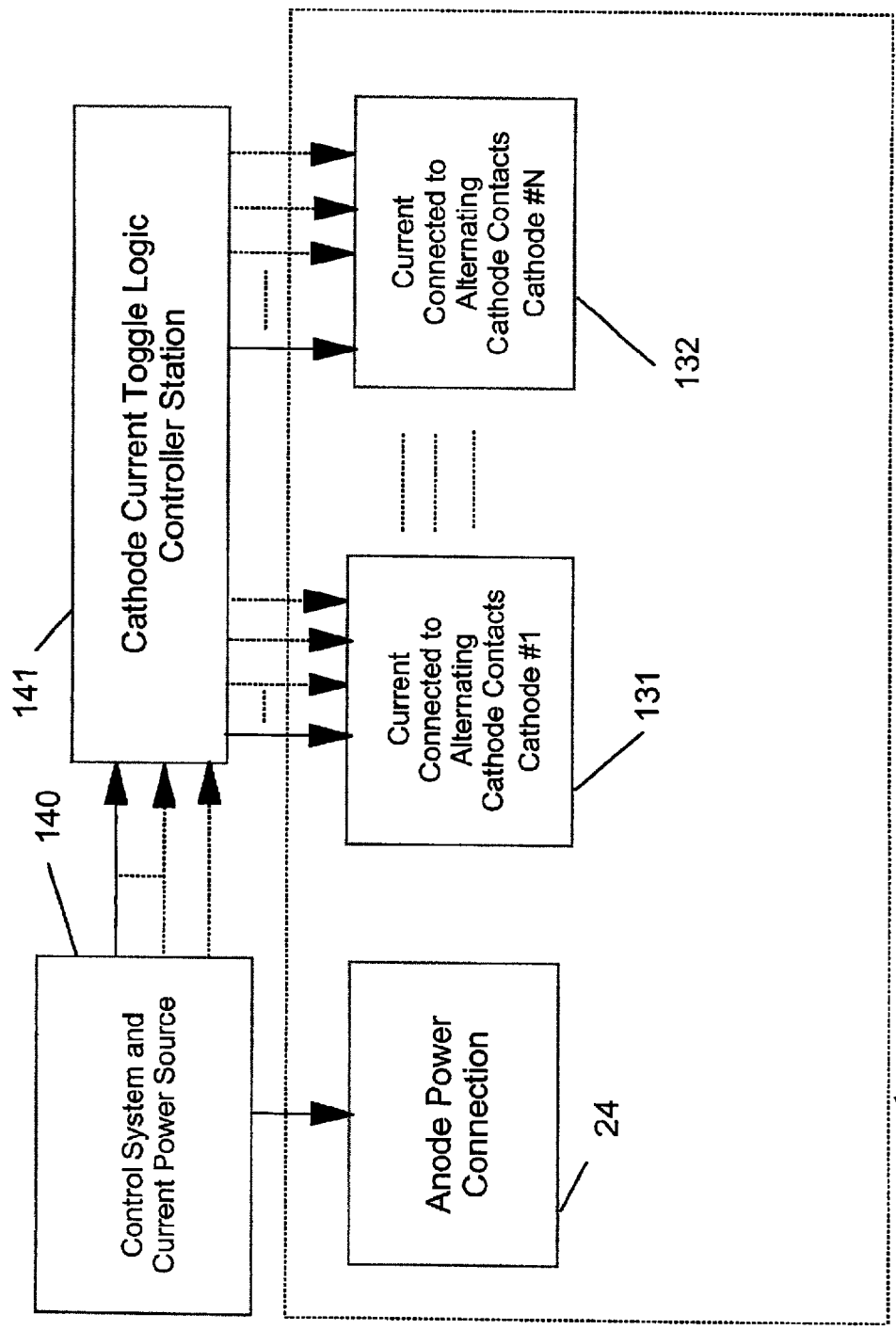
FIG. 14 is a schematic illustration a control system and current power source along with a cathode current toggle logic control station.

FIG. 14 is a schematic illustration of a control system and current power source 140 along with a cathode current toggle logic control station 141. Control system and current power source 140 can logically control one or more current outputs from one or more current sources. Cathode current toggle logic control system 141 can receive a plurality of input sources and then logically control outputs to multi-cathodes each having one or more contact points. As depicted, one or more toggle switched current nodes can be logically inputted to one or more multi-locations in cathode 131 and as can additional outputs be logically controlled to a string of "N" cathodes (cathode "N" 132 is shown). Anode power connection 24 and chamber wall 15 is as described above.

Figure 15:
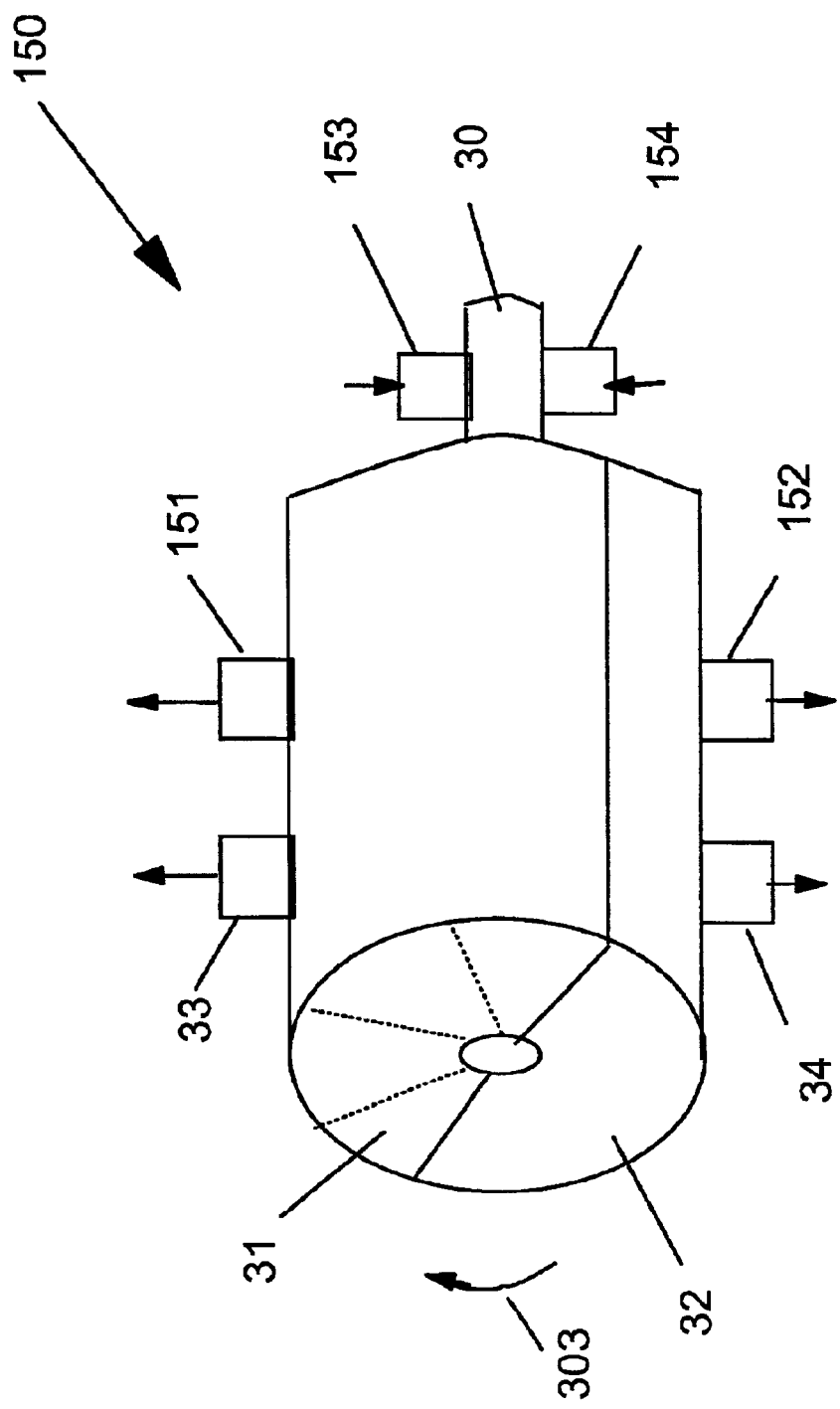
FIG. 15 is a side perspective drawing of an cylindrical shaped current toggle mechanism depicting multiple current inputs and multiple toggled outputs.

FIG. 15 is a side perspective drawing of a cylindrical shaped current toggle mechanism 150 depicting multiple current inputs and multiple toggled outputs. FIG. 15 is an extension of the application as described in FIG. 3 above. The cylindrical toggle mechanism 150 is constructed to route brush connected first cathode input power 153 and second cathode input power 154 from the power control system to the cylinder shaft 30. As such, continuous contact is made between cathode input power 153, 154 and the cylinder shaft 30. It should also be noted that an alternate input power design could be applied (i.e. a stationary brush) to the rotating flat surface of conductive volumetric area 32. Cylinder 150 consists of the cylinder shaft 30, a nonconductive volumetric area 31, and a conductive volumetric area 32. The conductive volumetric area 32 is both mechanically and electrically connected to the cylinder shaft 30. The non-conductive volumetric area 31 can be "air" or can be filled with a high density insulating material to offset the weight balance of the cylinder. Output brushes 33, 34, 151, 152 come into contact with conductive volumetric area 32 which is somewhat larger than half the cross-sectional area to insure contact with one or both brushes at any moment in time. As the cylinder 150 rotates 303, the design will insure that at least one output contact brush remains active as any other opposite output contact brush makes contact, with some overlap, in order to avoid an "infinite" load being presented to the power system current source. The frequency of rotation of cylindrical toggle mechanism 150 controls the current switching speed. Rotation speed of the cylinder can be controlled by such means as a variable speed motor driving the shaft directly, or connected to the cylinder (or shaft) by a gear mechanism. Using the toggle mechanism such as shown in cylindrical toggle mechanism 150, arc can be made to travel between any two selected cathode contact points in a predetermined manner.

Figure 16:
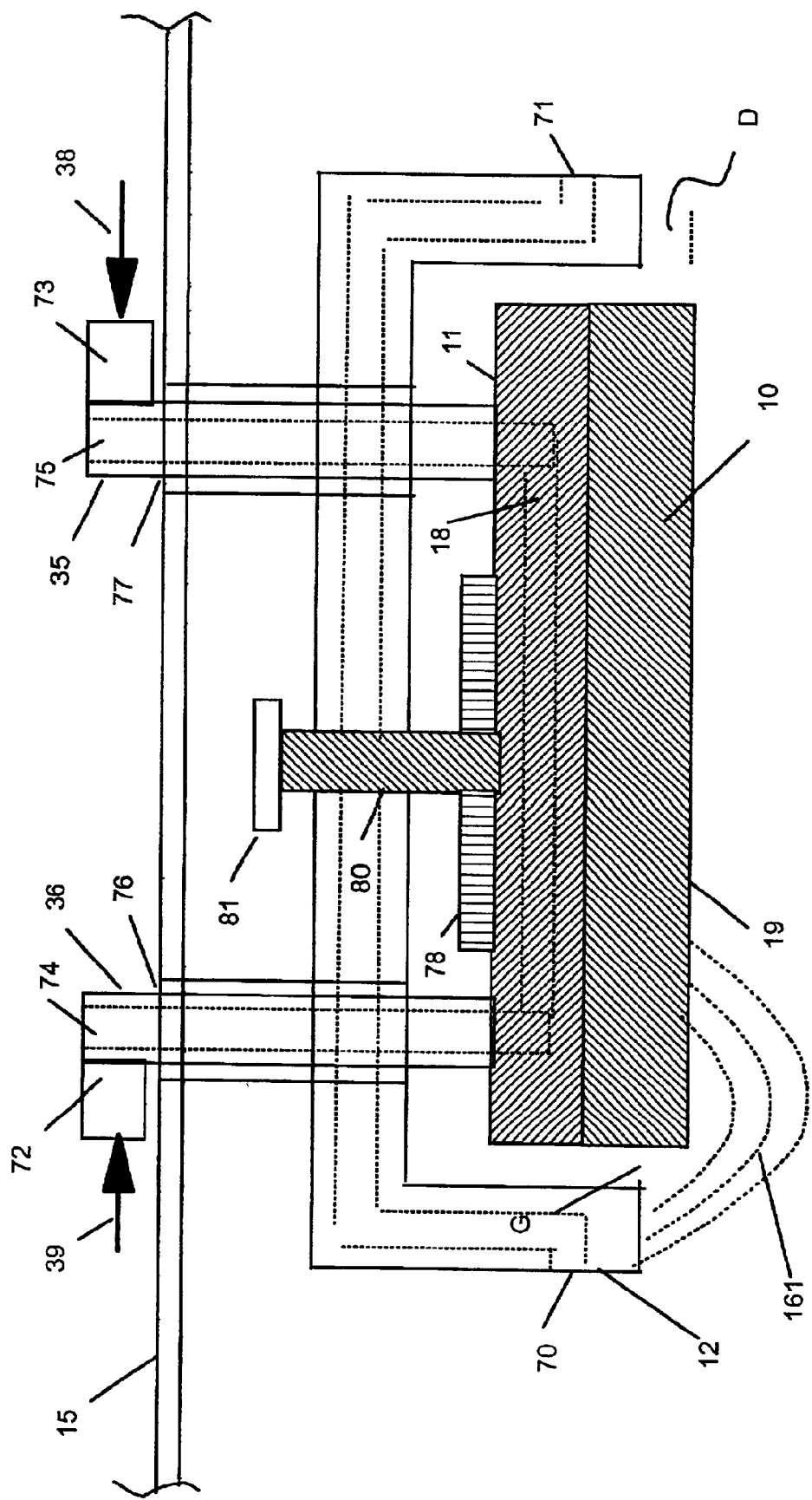
FIG. 16 is side cross-sectional drawing of an adjustable anode without insulator as the target depletes.

FIG. 16 is a side cross-sectional drawing of an adjustable anode 12 with no insulator as target 10 depletes. Cathode 11, target 10 are separated from anode 12 by gap G. Arc 161 is depicted in FIG. 16. All other aspects of FIG. 16 are as described above in FIG. 8.

Although the present invention has been described with reference to preferred embodiments, numerous modifications and variations can be made and still the result will come within the scope of the invention. No limitation with respect to the specific embodiments disclosed herein is intended or should be inferred.

We claim:

1. A toggle switch comprising:
   a negative pole;
   a cathode having a plurality of contact nodes;
   a switch connecting the negative pole to each contact node in a time sharing mode;
   said time sharing mode comprising a momentary overlap between switched members of the plurality of contact nodes;
   a time sharing frequency controller to control a time sharing frequency amongst the plurality of contact nodes, thereby allowing an arc to discharge continuously between the cathode and an anode; and
   wherein the negative pole further comprises a constant contact mechanism with a rotating switch pole.

2. The apparatus of claim 1, wherein the constant contact mechanism further comprises a shall around which rotates the rotating switch pole, said rotating switch pole further comprising a cylindrical body having at least one insulated segment and one conductive segment, wherein the insulated and the conductive segments alternately contact a fixed first contact which is electrically connected to a first cathode contact node and alternately contacts a fixed second contact which is electrically connected to a second contact node.

3. The apparatus of claim 2, wherein the anode further comprises an inside segment of an interior wall of a vacuum chamber, the cathode is mounted inside the vacuum chamber, and the switch is mounted outside the vacuum chamber.

4. The apparatus of claim 3, wherein the time sharing frequency controller further comprises a variable speed motor rotating the rotating switch pole.

5. The apparatus of claim 2, wherein the fixed first and second contact each further comprise an electrical contact brush.

6. A current toggle switch for a cathode in a vacuum chamber, said current toggle switch comprising:
   a cathode means functioning to form an arc between itself and an anode means;
   said cathode means having at least two contact node means functioning to steer the arc across a target surface of the cathode means;
   a current switching means functioning to controllably direct a current flow from one contact node means to another contact node means and provide a momentary overlap of the current between the first and second contact node means; and
   wherein the current switching means further comprises a variable speed motor rotating a disc means having a conductive segment and a non-conductive segment, wherein the conductive segment alternately electrically contacts said contact node means.

7. In a vacuum arc deposition system having a vacuum chamber, an anode and a cathode, wherein an arc discharges between the anode and the cathode, an improvement comprising:
   a cathode having a plurality of electrical contacts;
   a rotating cathode current source;
   a fixed electrical contact hub for each electrical contact; and
   wherein the rotating cathode current source contacts each fixed electrical contact hub to provide a momentary overlap of current between a pair of fixed electrical contact hubs before directing all the current to the next member of the pair of fixed electrical contact hubs, thereby causing the arc to be steered by the movement of current amongst the plurality of electrical contacts in a continuous manner without interruption.

8. The improvement of claim 7, wherein the rotating cathode current source further comprises a disc having a peripheral contact edge, said edge having a conductive and a non-conductive segment.

9. The improvement of claim 8, wherein the rotating cathode current source further comprises a central shaft supplying the cathode current to the conductive segment.

10. The improvement of claim 9 further comprising a variable speed motor to rotate the rotating cathode current source.

11. In a vacuum arc deposition system having a vacuum chamber, an anode and a cathode, wherein an arc discharges between the anode and the cathode, an improvement comprising:
   a cathode having a plurality of electrical contacts;

a rotating cathode current source;
a fixed electrical contact hub for each electrical contact;
wherein the rotating cathode current source contacts each fixed electrical contact hub to provide a momentary overlap of current between a pair of fixed electrical contact hubs before directing all the current to the next member of the pair of fixed electrical contact hubs, thereby causing the arc to be steered by the movement of current amongst the plurality of electrical contacts in a continuous manner without interruption;
wherein the rotating cathode current source further comprises a disc having a peripheral contact edge, said edge having a conductive and a non-conductive segment;
wherein the rotating cathode current source further comprises a central shaft supplying the cathode current to the conductive segment; and
wherein a variable speed motor rotates the rotating cathode current source.

12. In a vacuum arc deposition system having a vacuum chamber, an anode and a cathode, wherein an arc discharges between the anode and the cathode, an improvement comprising:
a cathode having a plurality of electrical contacts;
a reciprocating cathode current source;
a fixed contact hub connected to each cathode electrical contact; and
wherein the reciprocating cathode current source sequentially contacts each fixed contact hub to provide a momentary overlap of current before directing all the current to the next fixed contact hub to be contacted, thereby causing the arc to be steered by the movement of current between the plurality of cathode electrical contacts in a continuous manner without interruption.

13. In a vacuum arc deposition system having a vacuum chamber, an anode and a cathode, wherein an arc discharges between the anode and the cathode, an improvement comprising:
a plurality of cathodes each having a plurality of electrical contacts;
a switching cathode current source to provide an arc simultaneously to each cathode;
said switching cathode current source having a separate switch for each cathode; and
wherein the switching cathode current source contacts a first and a second electrical contact on each cathode to provide a momentary overlap of current between them before directing all the current to the next contact in line to be contacted, thereby causing several arcs each to be steered by the movement of current between the plurality of cathode electrical contacts on each cathode in a continuous manner without interruption.

14. A current toggle switch for a cathodic arc, said switch comprising:
a negative pole;
a cathode body having a plurality of contact nodes;
an anode;
a power supply to sustain an arc between the cathode and the anode;
a switch connecting the negative pole to each cathode contact node in a time sharing mode;
a time sharing frequency controller to control a time sharing frequency amongst the plurality of cathode contact nodes;
a cathodic arc target attached to said cathode body; said cathodic arc target having an erosion surface; an insulator member of electronically non-conductive material, said insulator member being disposed around said cathode body and insulating said cathode body from the walls of said chamber;
said cathode body being positioned within said insulator member and said cathodic arc target being positioned in electrical contact with said cathode body, a gap between the cathode body and the insulator member, and a gap between the cathodic arc target and the insulator member;
said insulator member cross-section having a "C" shape, with a pair of ends aligned with a plane of the target erosion surface;
said cathode body having a back side; and
a magnet mounted to the back side so as to face the insulator member.

15. The apparatus of claim 14, wherein the switch connecting the negative pole to each cathode contact node further comprises an electronic switch.

16. In a vacuum arc deposition system having a vacuum chamber, an anode and a plurality of cathodes, wherein an arc discharges between the anode and each cathode, an improvement comprising:
each cathode having a plurality of electrical contacts;
a cathode current controller;
said cathode current controller having a current input, a plurality of current outputs, a logic module to control desired combinations of inputs to outputs; and
wherein the cathode current controller for each cathode sequentially contacts a first and a second electrical contact to provide a momentary overlap of current between them before directing all the current to the second electrical contact, then repeating the process to the next in line to be contacted, thereby causing an arc on each cathode to be steered by the movement of current between the plurality of cathode electrical contacts in a continuous manner without interruption.

17. A starter for an arc in a cathodic arc vapor deposition chamber, said starter comprising:
a cathode having a negative potential;
a target attached to the cathode;
a striker assembly attached to the target;
said striker assembly comprising an electrically insulating solid core having a conductive outer surface;
said conductive outer surface having a physical contact with the target;
a switch connected between the striker's conductive outer surface and a source of a different potential than the cathode;
wherein a momentary closure of the switch causes a current flow through the conductive outer surface, thereby depleting the conductive outer surface and creating a spark to initiate an arc to an anode; and
wherein the target re-coats the striker during a cathodic arc deposition process.

18. A cathodic arc cathode within a chamber, said cathode having a cathodic arc target, said cathodic arc target having an arc evaporation surface;
a cathode body;
an insulator member of electronically non-conductive material, said insulator member being disposed around said cathode body and insulating said cathode body from the walls of said chamber;
said cathode body being positioned within said insulator member and said cathodic arc target being positioned in electrical contact with said cathode body, a gap between the cathode body and the insulator member and a gap between the cathodic arc target and the insulator member;

said insulator member cross-section having a "C" shape, with a pair of ends aligned with a plane of a target arc evaporation surface;

an adjustment mechanism to adjust the pair of ends to maintain the alignment with the target arc evaporation surface as the target arc evaporation surface erodes;

said cathode body having a plurality of contact nodes; and a time sharing frequency controller to control a time sharing frequency amongst the plurality of cathode contact nodes without a use of an arc sensor.

19. A toggle switch comprising:

a negative pole;

a cathode having a plurality of contact nodes;

a switch connecting the negative pole to each contact node in a time sharing mode;

said time sharing mode comprising a momentary overlap between switched members of the plurality of contact nodes;

a time sharing frequency controller to control a time sharing frequency amongst the plurality of contact nodes without a use of an arc sensor, thereby allowing an arc to discharge continuously between the cathode and an anode; and said cathode having a back side with a magnet mounted thereon.

20. A toggle switch comprising:

a negative pole;

a cathode having a plurality of contact nodes;

a switch connecting the negative pole to each contact node in a time sharing mode;

said time sharing mode comprising a momentary overlap between switched members of the plurality of contact nodes;

a time sharing frequency controller to control a time sharing frequency amongst the plurality of contact nodes, thereby allowing an arc to discharge continuously between the cathode and an anode;

a target mounted to the cathode and having an erosion surface; and said erosion surface having a pattern of grooves, thereby causing a pattern of vapor flux to focus on a workpiece.

21. A toggle switch comprising:

a negative pole;

a cathode having a plurality of contact nodes;

a switch connecting the negative pole to each contact node in a time sharing mode;

said time sharing mode comprising a momentary overlap between switched members of the plurality of contact nodes;

a time sharing frequency controller to control a time sharing frequency amongst the plurality of contact nodes without a use of an arc sensor, thereby allowing an arc to discharge continuously between the cathode and an anode; and wherein the cathode is powered by a pulsing current.

22. A toggle switch comprising:

a negative pole;

a cathode having a plurality of contact nodes;

a switch connecting the negative pole to each contact node in a time sharing mode;

said time sharing mode comprising a momentary overlap between switched members of the plurality of contact nodes without a use of an arc sensor;

a time sharing frequency controller to control a time sharing frequency amongst the plurality of contact nodes, thereby allowing an arc to discharge continuously between the cathode and an anode; and wherein the cathode is a cylinder which supports a cylindrical target mounted on an inside surface thereof, thereby facilitating a coating of an outside surface of a workpiece disposed inside the cylinder.

23. The apparatus of claim 22, wherein the cylinder is elongated having at least two pair of electrical contacts.

24. A toggle switch comprising:

a negative pole;

a cathode having a plurality of contact nodes;

a switch connecting the negative pole to each contact node in a time sharing mode;

said time sharing mode comprising a momentary overlap between switched members of the plurality of contact nodes without a use of an arc sensor;

a time sharing frequency controller to control a time sharing frequency amongst the plurality of contact nodes, thereby allowing an arc to discharge continuously between the cathode and an anode; and said cathode further comprises a cathode cylindrical body having an outer surface to support a cylindrical target, thereby facilitating a coating on a workplace disposed around the cylindrical target.

25. A toggle switch comprising:

a negative pole;

a cathode having a plurality of contact nodes;

a switch connecting the negative pole to each contact node in a time sharing mode;

said time sharing mode comprising a momentary overlap between switched members of the plurality of contact nodes; and a time sharing frequency controller to control a time sharing frequency amongst the plurality of contact nodes without a use of an arc sensor, thereby allowing an arc to discharge continuously between the cathode anode.

26. The apparatus of claim 25, wherein the negative pole further comprises constant contact mechanism with a rotating switch pole.

27. The apparatus of claim 25, wherein the time sharing frequency controller is electronic.

28. A current toggle switch for a cathode in a vacuum chamber, said current toggle switch comprising:

a cathode means functioning to form an arc between itself and an anode means;

said cathode means having at least two contact node means functioning to steer the arc across a target surface of the cathode means; and a current switching means functioning to controllably direct a current flow from one contact node means to another contact node means and provide a momentary overlap of the current between the first and second contact node means without a use of an arc sensor.

29. The apparatus of claim 28, wherein the current switching means further comprises a variable speed motor rotating a disc means having a conductive segment and a nonconductive segment, wherein the conductive segment alternately electrically contacts a contact node means.

30. The apparatus of claim 28, wherein the current switching means is electronic.

31. A current toggle switch for a cathodic arc, said switch comprising:

a negative pole;

a cathode body having a plurality of contact nodes;

an anode;

a power supply to sustain an arc between the cathode and the anode;

a switch connecting the negative pole to each cathode contact node in a time sharing mode; and a time sharing frequency controller to control a time sharing frequency amongst the plurality of cathode contact nodes without a use of an arc sensor.

* * * * *